(12) United States Patent
Lim et al.

(10) Patent No.: US 12,336,269 B2
(45) Date of Patent: Jun. 17, 2025

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Peng-Soon Lim, Johor (MY); Zi-Wei Fang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/416,737

(22) Filed: Jan. 18, 2024

(65) Prior Publication Data

US 2024/0234212 A1 Jul. 11, 2024

Related U.S. Application Data

(60) Continuation of application No. 17/826,129, filed on May 26, 2022, now Pat. No. 11,915,981, which is a
(Continued)

(51) Int. Cl.
*H10D 84/01* (2025.01)
*H01L 21/285* (2006.01)
(Continued)

(52) U.S. Cl.
CPC ....... *H10D 84/014* (2025.01); *H10D 84/0142* (2025.01); *H10D 84/0158* (2025.01); *H10D 84/038* (2025.01); *H10D 84/834* (2025.01); *H01L 21/28562* (2013.01); *H01L 21/28568* (2013.01); *H10D 64/017* (2025.01)

(58) Field of Classification Search
CPC ....... H01L 21/82345; H01L 21/823431; H01L 21/823456; H01L 21/28562; H01L 21/28568; H01L 27/0886; H01L 29/66545; H10D 84/014; H10D 84/0158; H10D 84/834; H10D 84/0142; H10D 84/038
See application file for complete search history.

(56) References Cited

U.S. PATENT DOCUMENTS 8,614,509 B2 * 12/2013 Kim ....... H10B 12/09
257/E21.627
8,729,627 B2   5/2014 Cheng et al.
(Continued)

*Primary Examiner* — Christine A Enad
(74) *Attorney, Agent, or Firm* — Maschoff Brennan

(57) ABSTRACT

A semiconductor device includes a semiconductor substrate, a first gate structure over the substrate, a second gate structure over the substrate, first gate spacers, second gate spacers, first and second metal layers spanning over the first and second gate structures, first and second contact plugs extending through the first and second metal layers, respectively. The first gate structure includes a first gate dielectric, and a first work function metal layer over the first gate dielectric. The second gate structure is wider than the first gate structure, wherein the second gate structure includes a second gate dielectric, a second work function metal layer over the second gate dielectric, and a filling conductor over the second work function metal layer. The first contact plug is in contact with the first work function metal layer, and the second contact plug is in contact with the filling conductor.

20 Claims, 28 Drawing Sheets

Related U.S. Application Data continuation of application No. 16/914,287, filed on Jun. 27, 2020, now Pat. No. 11,348,837, which is a division of application No. 16/103,724, filed on Aug. 14, 2018, now Pat. No. 10,707,131.

(51) Int. Cl.
*H10D 64/01* (2025.01)
*H10D 84/03* (2025.01)
*H10D 84/83* (2025.01)

(56) References Cited

U.S. PATENT DOCUMENTS

| | | | |
|---|---|---|---|
| 8,836,049 B2 | 9/2014 | Tsai et al. | |
| 9,209,273 B1 | 12/2015 | Lin et al. | |
| 9,496,361 B1 * | 11/2016 | Tung | H01L 21/823842 |
| 9,748,234 B2 | 8/2017 | Kwon et al. | |
| 2013/0264652 A1 | 10/2013 | Zhu et al. | |
| 2013/0320411 A1 | 12/2013 | Fan et al. | |
| 2016/0225868 A1 | 8/2016 | Kim et al. | |
| 2016/0315171 A1 * | 10/2016 | Hung | H01L 29/66545 |
| 2017/0207133 A1 | 7/2017 | Chang et al. | |
| 2018/0005876 A1 | 1/2018 | Tung et al. | |
| 2018/0301540 A1 | 10/2018 | Ando et al. | |

* cited by examiner

SEMICONDUCTOR DEVICE AND MANUFACTURING METHOD THEREOF

RELATED APPLICATION

The present application is a Continuation application of U.S. application Ser. No. 17/826,129, filed on May 26, 2022, which is a Continuation application of U.S. application Ser. No. 16/914,287, filed on Jun. 27, 2020, now U.S. Pat. No. 11,348,837, issued on May 31, 2022, which is a Divisional application of U.S. application Ser. No. 16/103,724, filed on Aug. 14, 2018, now U.S. Pat. No. 10,707,131, issued on Jul. 7, 2020, which is hereby incorporated by reference herein.

BACKGROUND

As the semiconductor industry has strived for higher device density, higher performance, and lower costs, problems involving both fabrication and design have been encountered. One solution to these problems has been the development of a fin-like field effect transistor (FinFET). A FinFET includes a thin vertical 'fin' formed by etching spaced recesses into a substrate. The source, drain, and channel regions are defined within this fin. The transistor's gate wraps around the channel region of the fin. This configuration allows the gate to induce current flow in the channel from three sides. Thus, FinFET devices have the benefit of higher current flow and reduced short-channel effects.

The dimensions of FinFETs and other metal oxide semiconductor field effect transistors (MOSFETs) have been progressively reduced as technological advances have been made in integrated circuit materials. For example, high-k metal gate (HKMG) processes have been applied to FinFETs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
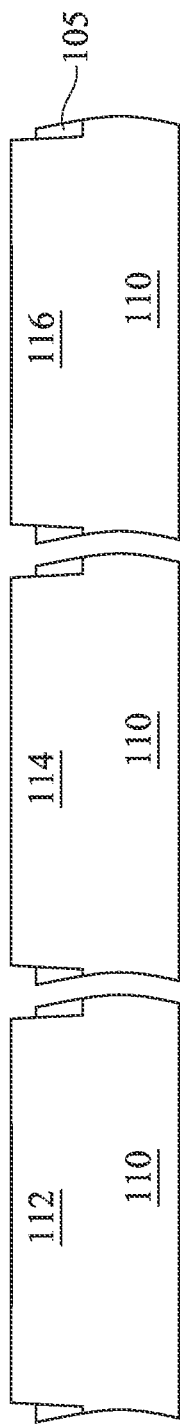
FIGS. 1 to 13 are cross-sectional views of a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Examples of devices that can be improved from one or more embodiments of the present application are semiconductor devices. Such a device, for example, may be a Fin field effect transistor (FinFET) device. The following disclosure will continue with a FinFET example to illustrate various embodiments of the present application. It is understood, however, that the application should not be limited to a particular type of device.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIGS. 1 to 13 are cross-sectional views of a method for manufacturing a semiconductor device at various stages in accordance with some embodiments of the present disclosure.

Reference is made to FIG. 1. A substrate 110 is provided. In some embodiments, the substrate 110 includes silicon. Alternatively, the substrate 110 may include germanium, silicon germanium, gallium arsenide or other appropriate semiconductor materials. Also alternatively, the substrate 110 may include an epitaxial layer. For example, the substrate 110 may have an epitaxial layer overlying a bulk semiconductor. Further, the substrate 110 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrate may be formed by selective epitaxial growth (SEG). Furthermore, the substrate 110 may include a semiconductor-on-insulator (SOI) structure. Also alternatively, the substrate 110 may include a buried dielectric layer, such as a buried oxide (BOX) layer, such as that formed by separation by implantation of oxygen (SIMOX) technology, wafer bonding, SEG, or other appropriate method.

Semiconductor fins 112, 114 and 116 are formed on the substrate 110. In some embodiments, the semiconductor fins 112, 114 and 116 include silicon. The semiconductor fins 112, 114 and 116 may be formed, for example, by patterning and etching the substrate 110 using photolithography techniques. In some embodiments, a layer of photoresist material (not shown) is sequentially deposited over the substrate 110. The layer of photoresist material is irradiated (exposed) in accordance with a predetermined pattern (the semiconductor fins 112, 114 and 116 in this case) and developed to remove portions of the photoresist material. The remaining photoresist material protects the underlying material from subsequent processing steps, such as etching. It is noted that other masks, such as an oxide or silicon nitride mask, may also be used in the etching process. The quantity of the semiconductor fins is exemplary, and is not limiting the disclosure.

An isolation dielectric 105 is formed to fill trenches among the semiconductor fins 112, 114 and 116 as shallow trench isolation (STI). The isolation dielectric 105 may include any suitable dielectric material, such as silicon oxide. The method of forming the isolation dielectric 105 may include depositing an isolation dielectric 105 on the substrate 110 to cover the semiconductor fins 112, 114 and 116, optionally performing a planarization process to remove the excess isolation dielectric 105 outside the trenches, and then performing an etching process on the isolation dielectric 105 until upper portions of the semiconductor fins 112, 114 and 116 are exposed.

Figure 2:
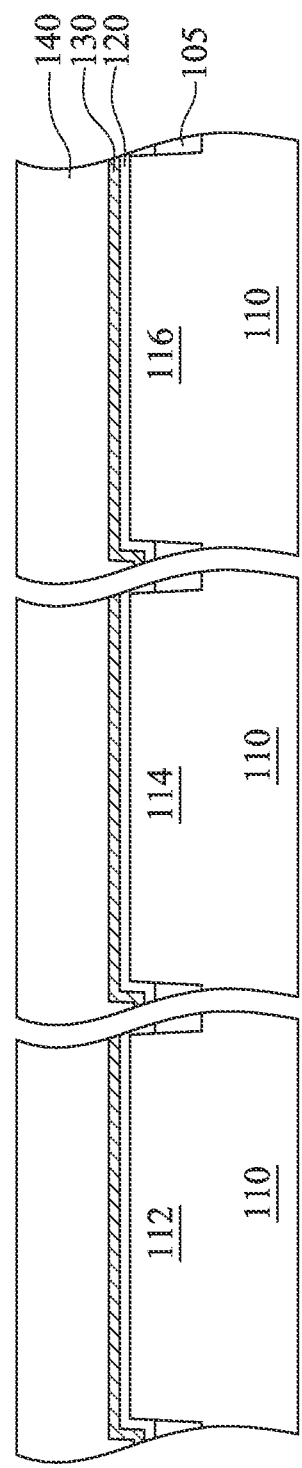

Reference is made to FIG. 2. A gate dielectric layer 120, a capping layer 130, and a dummy gate layer 140 are sequentially formed over the substrate 110, in which the capping layer 130 is over the gate dielectric layer 120, and the dummy gate layer 140 is over the capping layer 130.

Gate dielectric layer 120 is formed blanket over the semiconductor fins 112, 114 and 116, and the substrate 110, respectively. The gate dielectric layer 120 may compose of multi-layer, where the first layer is interlayer oxides formed by wet clean, and/or thermal oxidation; followed by a high-k layer formed by atomic layer deposition, chemical vapor deposition, sputtering, or other suitable methods for forming a gate dielectric. The gate dielectric layer 120 may include, for example, a Si-containing interlayer oxide followed by a high-k dielectric material such as metal oxides, metal silicates, transition metal-oxides, transition metal-silicates, oxynitrides of metals, metal aluminates, zirconium silicate, zirconium aluminate, or combinations thereof. In some embodiments, the gate dielectric layer 120 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

The capping layer 130 may be formed by CVD, PVD, ALD, or other suitable techniques. In some embodiments, the capping layer 130 may include metal, such as titanium (Ti), tantalum (Ta), or suitable materials. In some other embodiments, the capping layer 130 may include metal nitride, such as TiN, TaN, and WN. In some occasions, the capping layer 130 can be doped with elements such as C, Si or Al. In some other embodiments, the capping layer 130 may be a composite layer, such as Ti/TiN layer, Ta/TaN layer, etc.

The dummy gate layer 140 may be formed by CVD, sputter deposition, or by other suitable technique for depositing conductive materials. The dummy gate layer 140 may include polycrystalline-silicon (poly-Si) or poly-crystalline silicon-germanium (poly-SiGe).

Figure 3:
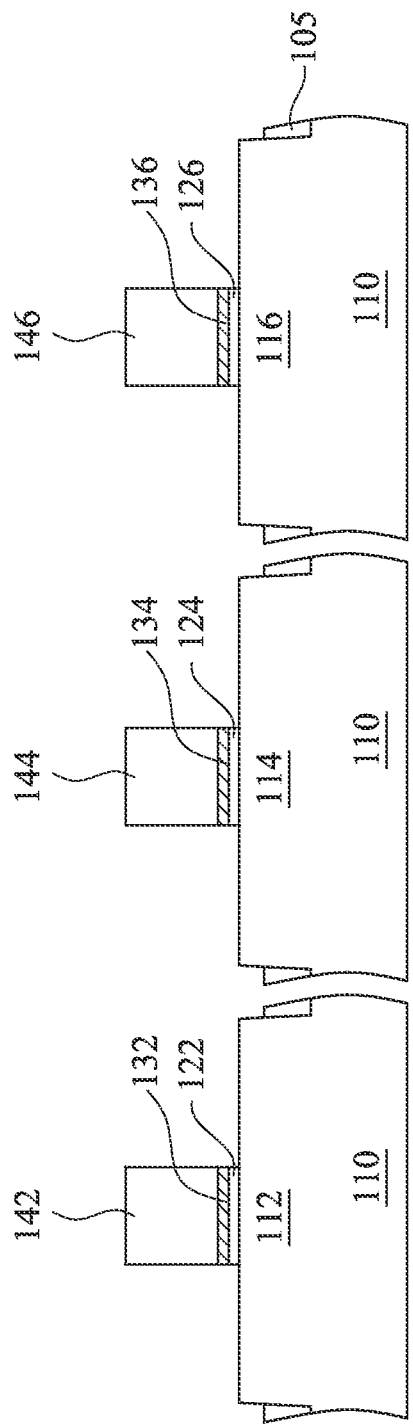

Reference is made to FIG. 3. The gate dielectric layer 120, the capping layer 130, and the dummy gate layer 140 are patterned to form a plurality of gate dielectrics 122, 124, and 126, a plurality of capping layers 132, 134, and 136, and a plurality of dummy gate structures 142, 144, and 146. For example, gate dielectric layer 120, the capping layer 130, and the dummy gate layer 140 are patterned to respectively wrap central portions of the semiconductor fins 112, 114 and 116 and respectively expose portions of the semiconductor fins 112, 114 and 116. In some embodiments, the gate dielectric layer 120, the capping layer 130, and the dummy gate layer 140 may be patterned using the same mask, so as to form stacks each including a gate dielectric, a capping layer over the gate dielectric and a dummy gate structure over the capping layer.

Figure 4:
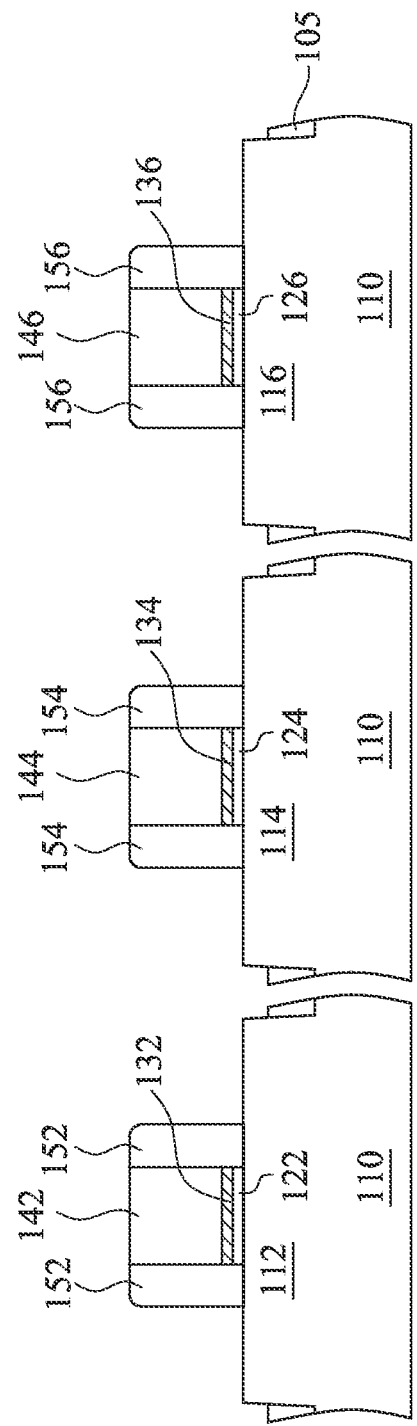

Reference is made to FIG. 4. Gate spacers 152 are formed on the substrate 110 and respectively along opposite sides of the dummy gate structure 142, gate spacers 154 are formed on the substrate 110 and respectively along opposite sides of the dummy gate structure 144, and gate spacers 156 are formed on the substrate 110 and along opposite sides of the dummy gate structure 146. In some embodiments, the gate spacers 152, 154 and 156 may include silicon oxide, silicon nitride, silicon oxy-nitride, or other suitable material. The gate spacers 152, 154 and 156 may include a single layer or multilayer structure. To form the gate spacers 152, 154 and 156, a blanket layer may be formed on the substrate 110 by CVD, PVD, ALD, or other suitable technique. Then, an anisotropic etching is performed on the blanket layer to form the gate spacers 152, 154 and 156 respectively on opposite sides of the dummy gate structures 142, 144 and 146. In some embodiments, the gate spacers 152, 154 and 156 can be used to offset subsequently formed doped regions, such as source/drain regions. The gate spacers 152, 154 and 156 can further be used for designing or modifying the source/drain region (junction) profile.

Figure 5:
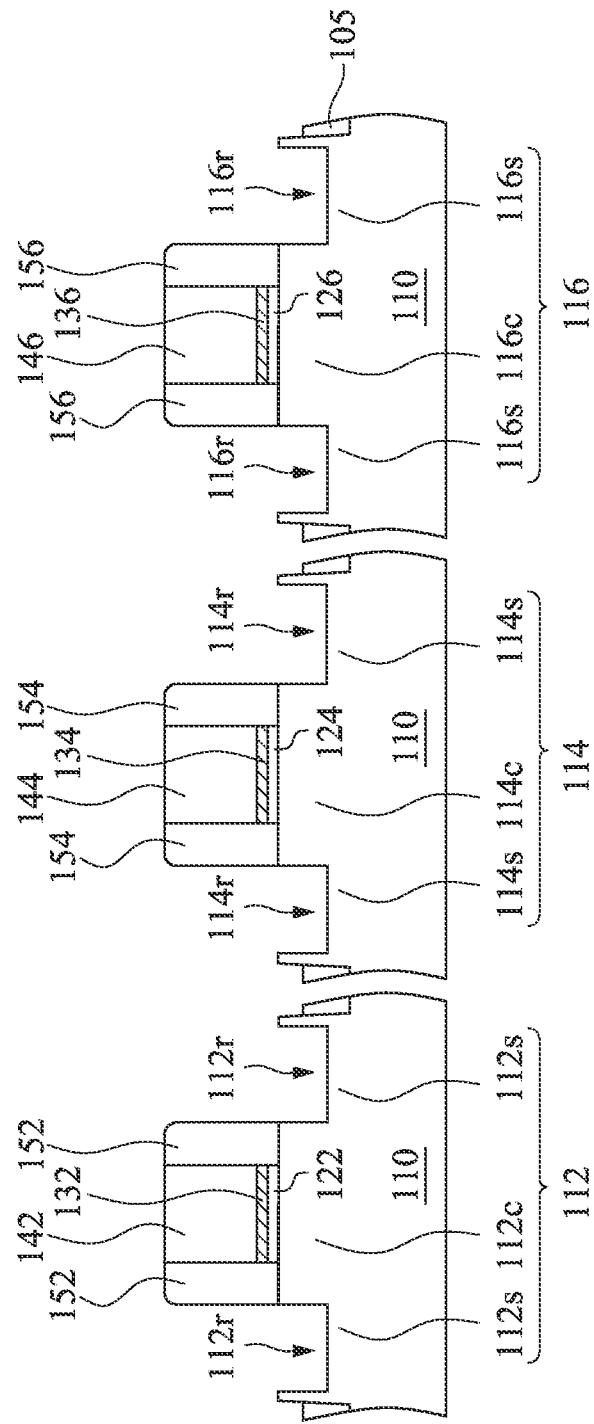

Reference is made to FIG. 5. Portions of the semiconductor fins 112, 114 and 116 exposed by the dummy gate structures 142, 144 and 146 and the gate spacers 152, 154 and 156 are removed (or recessed) to form recesses 112r, 114r and 116r in the substrate 110. Any suitable amount of material may be removed. The remaining semiconductor fin 112 has a plurality of source/drain portions 112s, and a portion of the semiconductor fin 112 between the source/drain portions 112s can serve as a semiconductor channel 112c. Similarly, there are a plurality of source/drain portions 114s and a semiconductor channel 114c present in the remaining semiconductor fin 114, and there are a plurality of source/drain portions 116s and a semiconductor channel 116c present in the remaining semiconductor fin 116. The source/drain portions 112s, 114s and 116s are embedded in the substrate 110 and portions thereof are exposed by the recesses 112r, 114r and 116r, respectively. The semiconductor channels 112c, 114c and 116c respectively underlie the dummy gate structures 142, 144 and 146.

Removing portions of the semiconductor fins 112, 114 and 116 may include forming a photoresist layer or a capping layer (such as an oxide capping layer) over the structure of FIG. 4, patterning the photoresist or capping layer to have openings that expose portions of the semiconductor fins 112, 114 and 116, and etching the exposed portions of the semiconductor fins 112, 114 and 116. In some embodiments, the semiconductor fins 112, 114 and 116 can be etched using a dry etching process. Alternatively, the etching process is a wet etching process or combination of dry and wet etching process. Removal may include a lithography process to facilitate the etching process. The lithography process may include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography process is implemented or replaced by other methods, such as maskless photolithography, electron-beam writing, and ion-beam writing. In yet some other embodiments, the lithography process could implement nanoimprint technology. In some embodiments, a pre-cleaning process may be performed to clean the recesses 112r, 114r and 116r with hydrogen fluoride (HF) or other suitable solution.

Figure 6:
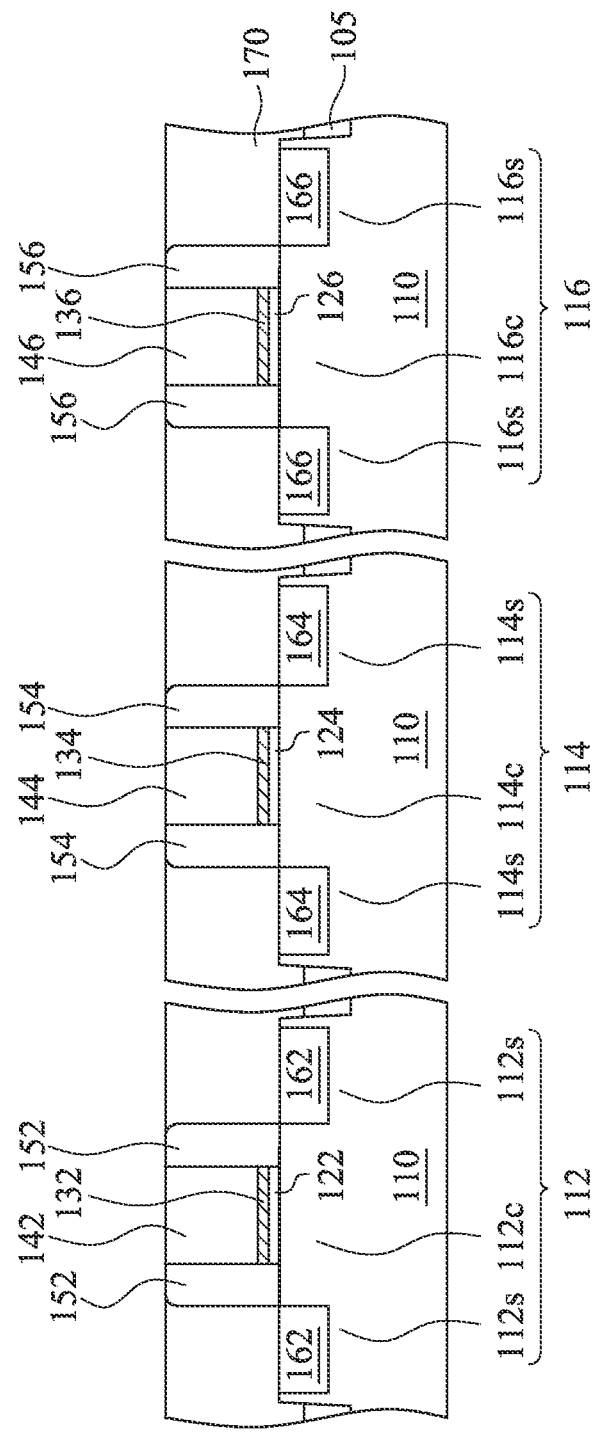

Reference is made to FIG. 6. A plurality of epitaxy structures 162, 164 and 166 are respectively formed in the recesses 112r, 114r and 116r (see FIG. 5) and on the source/drain portions 112s, 114s and 116s. The epitaxy structures 162, 164 and 166 may be formed using one or more epitaxy or epitaxial (epi) processes, such that Si features, SiGe features, and/or other suitable features can be formed in a crystalline state on the source/drain portions 112s, 114s and 116s of the semiconductor fins 112, 114 and 116. In some embodiments, the lattice constants of the epitaxy structures 162, 164 and 166 are different from the lattice constants of the semiconductor fins 112, 114 and 116, so that semiconductor channels 112c, 114c and 116c can be strained or stressed by the epitaxy structures 162, 164 and 166 to improve carrier mobility of the semiconductor device and enhance the device performance. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the source/drain portions 112s, 114s and 116s of the semiconductor fins 112, 114 and 116 (e.g., silicon). Thus, strained or stressed semiconductor channels 112c, 114c and 116c can be achieved to increase carrier mobility and enhance device performance. The epitaxy structures 162, 164 and 166 may be in-situ doped. The doping species include P-type dopants, such as boron or $BF_2$; N-type dopants, such as phosphorus or arsenic; and/or other suitable dopants including combinations thereof. If the epitaxy structures 162, 164 and 166 are not in-situ doped, a second implantation process (i.e., a junction implant process) is performed to dope the epitaxy structures 162, 164 and 166. One or more annealing processes may be performed to activate the epitaxy structures 162, 164 and 166. The annealing processes include rapid thermal annealing (RTA) and/or laser annealing processes.

Thereafter, an interlayer dielectric (ILD) layer 170 is formed at outer sides of the gate spacers 152, 154 and 156 and on the substrate 110. The ILD layer 170 includes silicon oxide, silicon nitride, silicon oxynitride, silicon carbide, low-dielectric constant dielectric material or a combination thereof. The ILD layer 170 includes a single layer or multiple layers. The ILD layer 170 is formed by a suitable technique, such as CVD. A chemical mechanical planarization (CMP) process may be applied to remove excessive ILD layer 170 and expose top surfaces of the dummy gate structures 142, 144 and 146 to a subsequent dummy gate removal process.

Figure 7:
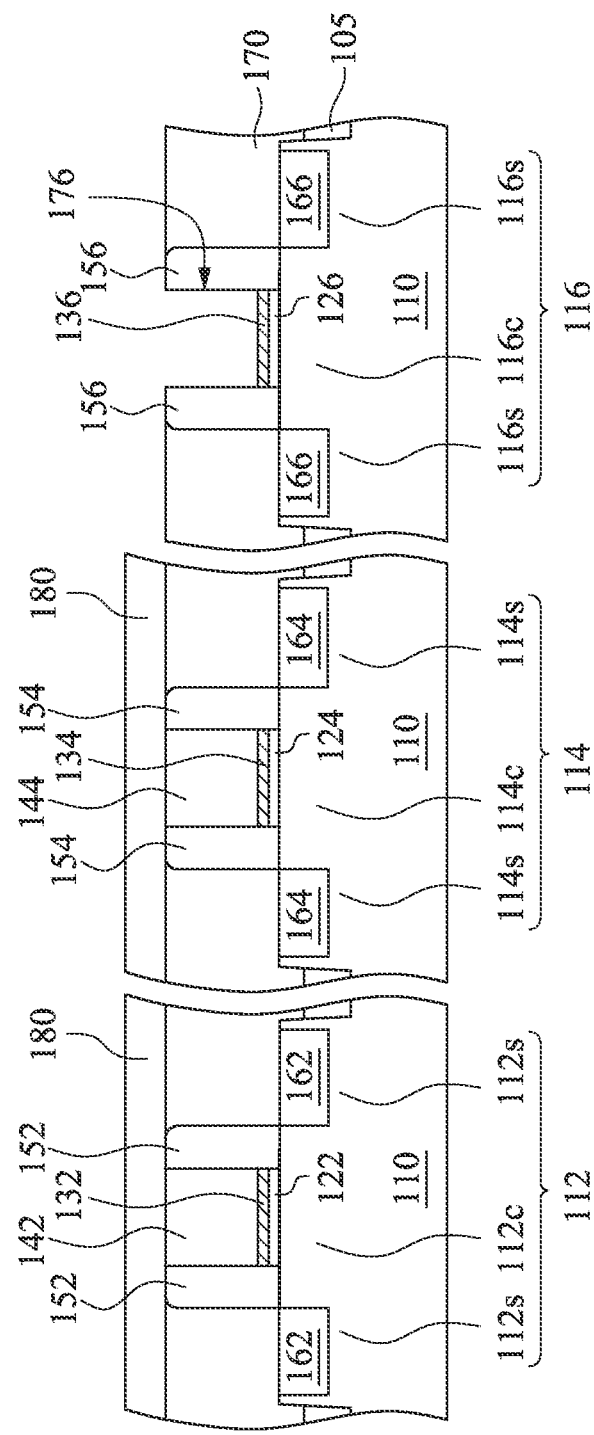

Reference is made to FIG. 7. A mask layer 180 is formed over the substrate 110 and is then patterned to expose the dummy gate structure 146. In greater details, the mask layer 180 covers the dummy gate structures 142 and 144 while leaves the dummy gate structure 146 (see FIG. 6) exposed. Then, the dummy gate structure 146 is removed to form a gate trench 176 with the gate spacers 156 as its sidewall. In some embodiments, the dummy gate structure 146 is removed while the gate dielectric 126 and the capping layer 136 retain as shown in FIG. 7. As a result, the gate trench 176 has a conductive bottom surface (i.e., a top surface of the conductive capping layer 136) and opposite dielectric sidewalls (i.e., sidewalls of the gate spacers 156) extending above the conductive bottom surface. In some embodiments, the dummy gate structure 146 may be removed by dry etching, wet etching, or a combination of dry and wet etching. For example, the etchants of the etching process may be HF, or HBr-based etch chemistry, so as to provide sufficient etching selectivity between the dummy gate structure 146 and the capping layer 136. After the dummy gate structure 146 is removed, the capping layer 136 is exposed from the gate trench 176.

Figure 8:
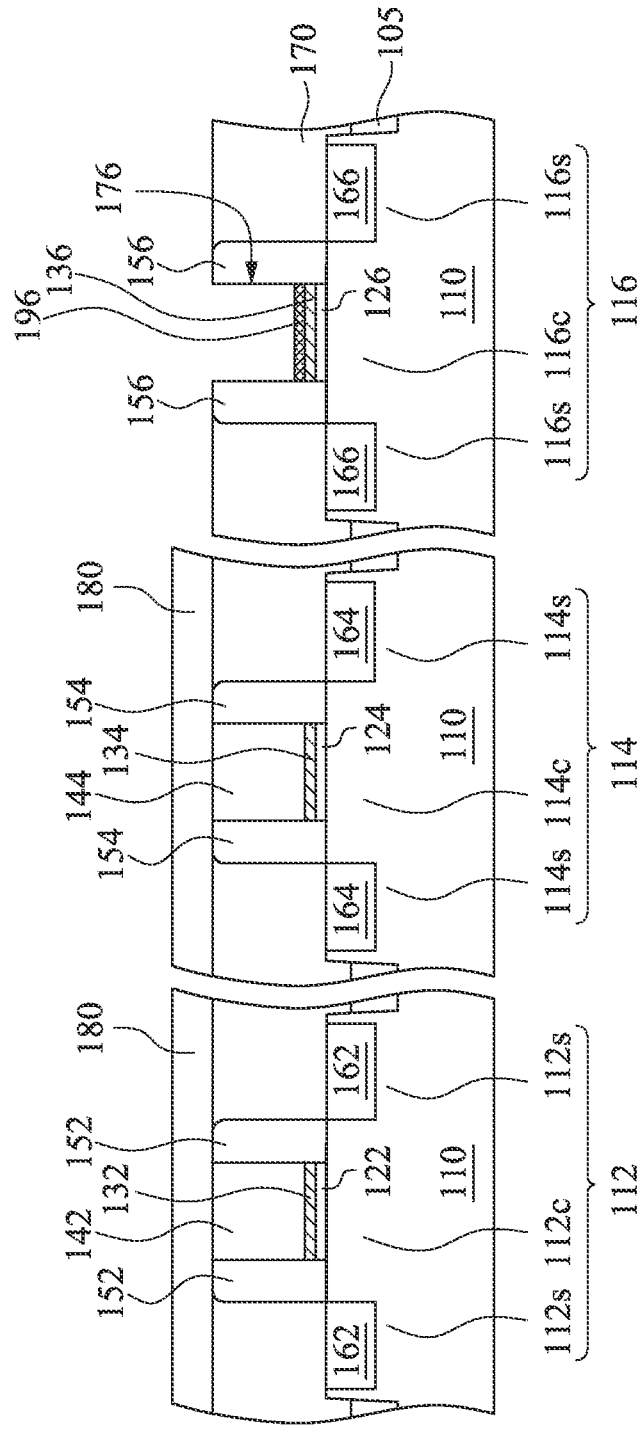

Reference is made to FIG. 8. A metal layer 196 is formed on the capping layer 136. In some embodiments, the metal layer 196 fills the gate trench 176 via a bottom-up approach. That is, the metal layer 196 is selectively grown on the capping layer 136, and thus the sidewalls of the gate trench 176 are substantially free from the growth of the metal layer 196, which in turn will facilitate the deposition of the metal layers formed in later steps, since the width of the gate trench 176 will not shrink during forming the metal layer 196. In some embodiments, the metal layer 196 may include but not limited to, for example, tungsten (W). In some embodiments, the thickness of the metal layer 196 is in a range from about 0.5 nm to about 3.5 nm.

In some embodiments, the metal layer 196 can be formed by suitable deposition process, such as ALD, CVD, or other suitable deposition process. Generally, the deposition process such as ALD or CVD involve the delivery of gaseous reactants to the substrate surface where a chemical reaction takes place under temperature and pressure conditions favorable to the thermodynamics of the reaction. As used herein, "atomic layer deposition" or "ALD" refers to a process where a substrate surface is alternately exposed to precursors and/or reagents (excluding any carrier gases, or other compounds not otherwise involved in deposition). As used herein, "chemical vapor deposition" or "CVD" refers to a process where a substrate surface is exposed to more than one precursor/reagent at a time.

In a bottom-up approach, the growth of a metal layer 196 has a different nucleation delay on a metal-containing surface (i.e., the capping layer 136) as compared to a dielectric surface (i.e., the gate spacers 156). Usually, the nucleation delay on the metal-containing surface is shorter than on the dielectric surface. The nucleation delay differences can be used to allow selective growth on the metal-containing surface. The present disclosure utilizes the selectivity to allow metal growth from a bottom of a trench (i.e. the capping layer 136) while limiting the growth from the dielectric side walls (i.e. the gate spacers 156). As a result, the deposition rate of the metal layer 196 on the metal-containing surface (i.e., the capping layer) is faster than that on the dielectric surface (i.e., the gate spacers 156).

The chemistries utilized for deposition will depend on the desired film. In some embodiments, a tungsten-containing layer is deposited to act as the metal layer 196. Tungsten has a work function higher than a mid-gap work function (about 4.5 eV) that is in the middle of the valance band and the conduction band of silicon, and thus tungsten can be referred to as a P-work function metal that can provide a work function suitable for PMOS devices. Tungsten may be deposited by using a suitable tungsten precursor. The tungsten precursor can be any suitable tungsten-containing gas including, but not limited to, halide based tungsten precursors or a metal-organic based tungsten precursor. For example, in some embodiments, the tungsten precursor may comprise tungsten pentachloride ($WCl_5$), compounds with the empirical formula of $WCl_5$ (e.g., $W_2Cl_{10}$, $W_3Cl_{15}$), tungsten hexachloride ($WCl_6$), compounds with the empirical formula of $WCl_6$ (e.g., $W_2Cl_{12}$), tungsten hexafluoride ($WF_6$). In one or more embodiments, the tungsten-containing precursor is selected from the group consisting of tungsten pentachloride, compounds with the empirical formula $WCl_5$ and tungsten hexachloride. A reducing agent may be used as a co-reagent to produce a film consisting essentially of tungsten. In some embodiments, the deposition process may be performed at a temperature in a range from about 400° C. to about 550° C.

Figure 9:
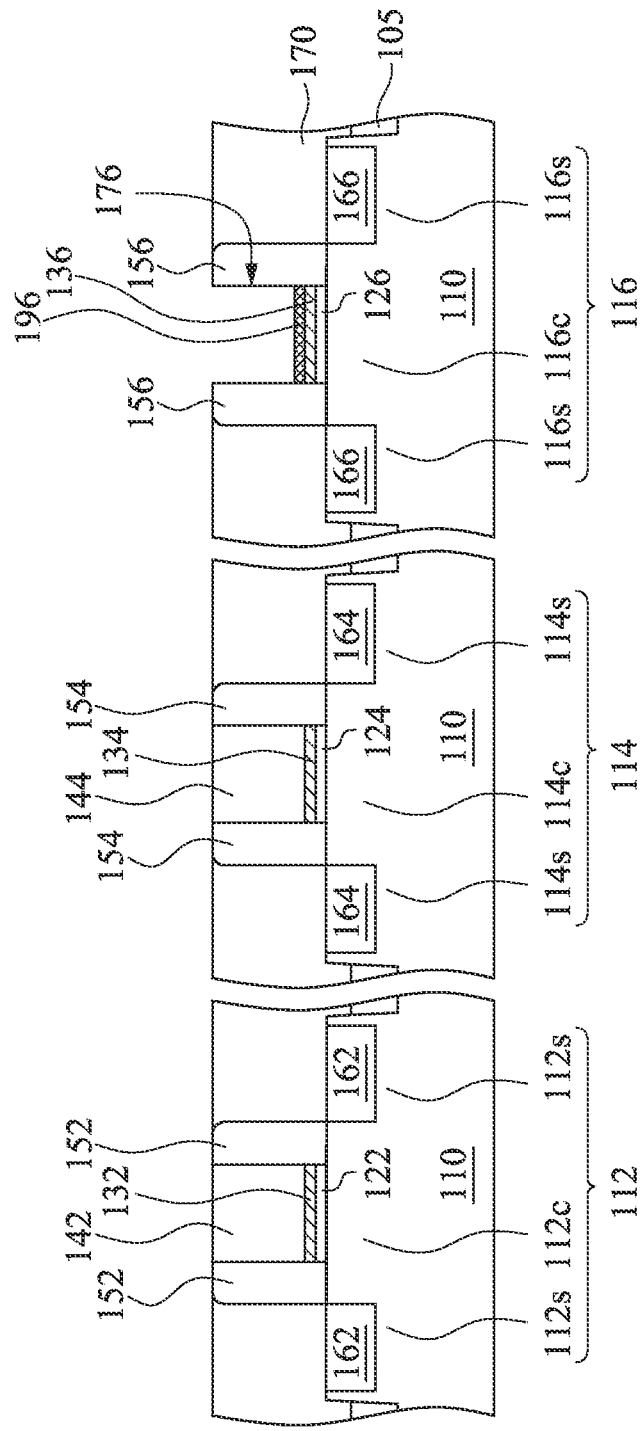

Reference is made to FIG. 9. The mask layer 180 is removed. After the mask layer 180 is removed, the top surfaces of the dummy gate structures 142 and 144 are exposed.

Figure 10:
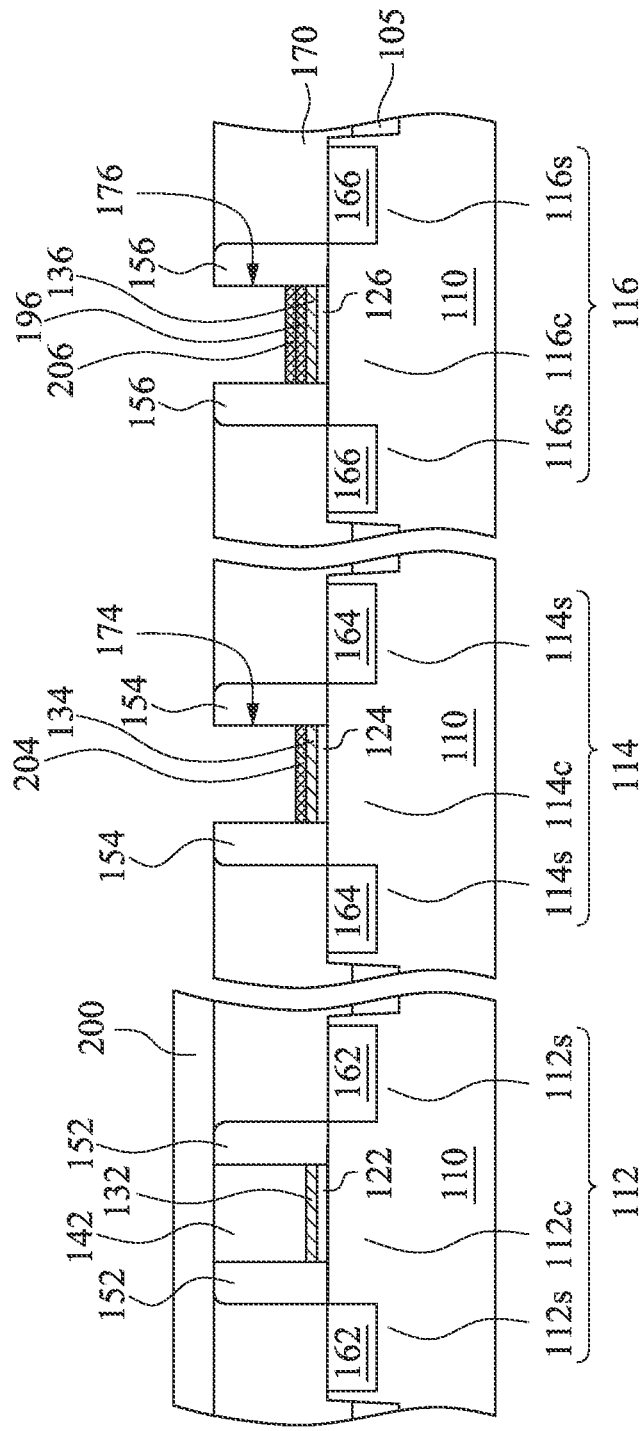

Reference is made to FIG. 10. A mask layer 200 is formed over the substrate 110 and is patterned to expose the capping layer 134 on the fin 114 and the metal layer 196 on the fin 116. In greater detail, the mask layer 200 covers the dummy gate structure 142 while leaves the dummy gate structure 144 (see FIG. 9) and the metal layer 196 exposed. Then, the dummy gate structure 144 is removed to form a gate trench 174 with the gate spacers 154 as its sidewall. In some embodiments, the dummy gate structure 144 is removed while the gate dielectric 124 and the capping layer 134 retain as shown in FIG. 10. In some embodiments, the dummy gate structure 144 may be removed by dry etching, wet etching, or a combination of dry and wet etching. For example, the etchants of the etching process may be HF or HBr-based etch chemistry so as to provide sufficient etching selectivity between the dummy gate structure 144 and the capping layer 134. After the dummy gate structure 144 is removed, the capping layer 134 is exposed from the gate trench 174.

Then, metal layers 204 and 206 are formed on the capping layer 134 and the metal layer 196, respectively. In some embodiments, the metal layers 204 and 206 fill the gate trenches 174 and 176 via a bottom-up approach. That is, the metal layers 204 and 206 are selectively grown on the capping layer 134 and the metal layer 196, and thus the sidewalls of the gate trenches 174 and 176 are substantially free from the growth of the metal layers 204 and 206, which in turn will facilitate the deposition of the metal layers formed in later steps, since the width of the gate trenches 174 and 176 will not shrink during forming the metal layers 204 and 206. In some embodiments, the metal layers 204 and 206 may include but not limited to, for example, tungsten (W). In some embodiments, the thickness of the metal layers 204 and 206 is in a range from about 0.5 nm to about 3.5 nm. In some embodiments, the thickness of the metal layer 204 may be substantially equal to the thickness of the metal layer 206. In some other embodiments, the thickness of the metal layer 206 may be substantially equal to the thickness of the metal layer 196. The formation of the metal layers 204 and 206 may be similar to that of the metal layer 196 described in FIG. 8, and thus similar descriptions in this aspect will not be repeated hereinafter.

Figure 11:
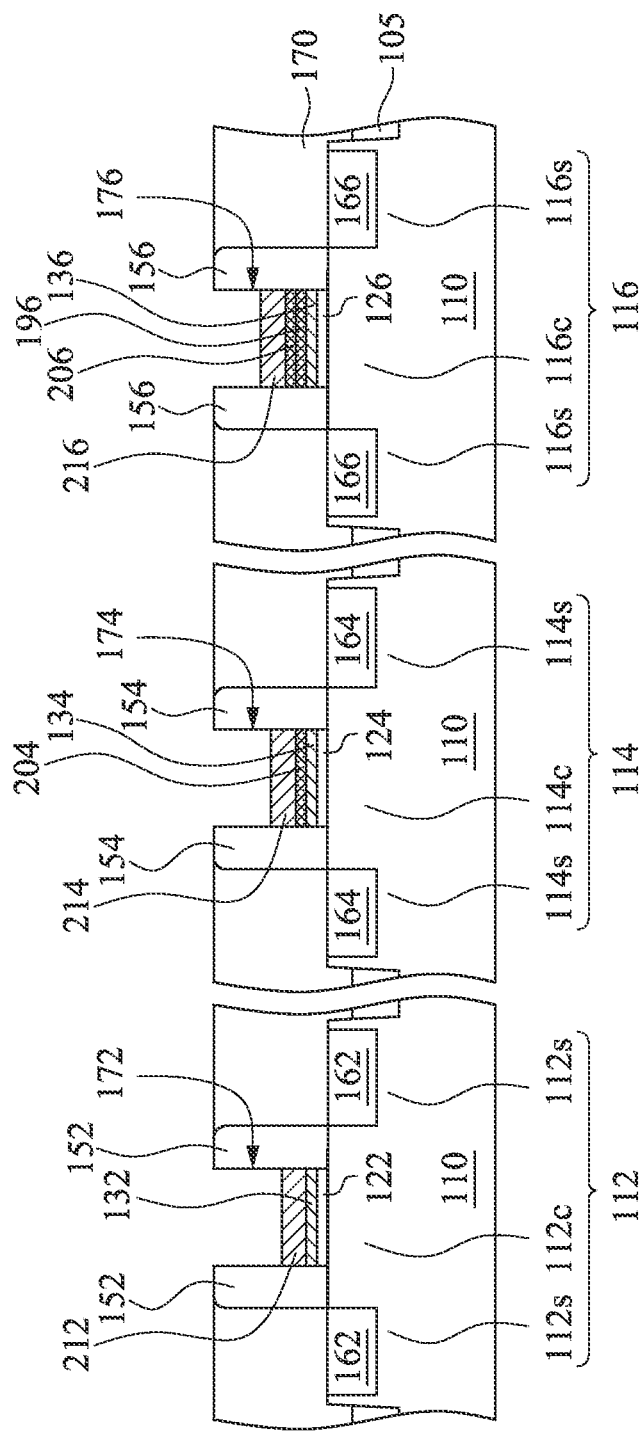

Reference is made to FIG. 11. The mask layer 200 is removed. After the mask layer 200 is removed, the top surface of the dummy gate structure 142 is exposed. In some embodiments where the mask layer 200 is a hard mask, the mask layer 180 may be removed by, for example, dry or wet etching.

Then, the dummy gate structure 142 is removed to form a gate trench 172 with the gate spacers 152 as its sidewall. In some embodiments, the dummy gate structure 142 is removed while the gate dielectric 122 and the capping layer 132 retain as shown in FIG. 11. In some embodiments, the dummy gate structure 142 may be removed by dry etching, wet etching, or a combination of dry and wet etching. For example, the etchants of the etching process may be HF or HBr-based etch chemistry, so as to provide sufficient etching selectivity between the dummy gate structure 142 and the capping layer 132. After the dummy gate structure 142 is removed, the capping layer 132 is exposed from the gate trench 172.

Then, metal layers 212, 214, and 216 are formed on the capping layer 132, the metal layer 204, and the metal layer 206, respectively. In some embodiments, the metal layers 212, 214, and 216 fill the gate trenches 172, 174, and 176 via a bottom-up approach. That is, the metal layers 212, 214, and 216 are selectively grown on the capping layer 132, the metal layer 204, and the metal layer 206, and thus the sidewalls of the gate trenches 172, 174, and 176 are substantially free from the growth of the metal layers 212, 214, and 216, which in turn will facilitate the deposition of the metal layers formed in later steps, since the width of the gate trenches 172, 174, and 176 will not shrink during forming the metal layers 212, 214, and 216. In some embodiments, the metal layers 204 and 206 may include bot not limited to, for example, tungsten (W). In some embodiments, the thickness of the metal layers 212, 214, and 216 is in a range from about 1.5 nm to about 4.0 nm. In some embodiments, the thicknesses of the metal layer 212, 214, and 216 may be substantially the same. In some other embodiments, the thicknesses of the metal layer 212, 214, and 216 may be larger than the thicknesses of the underlying metal layers thereof (i.e. metal layers 196, 204, and 206). The formation of the metal layers 212, 214, and 216 may be similar to that of the metal layer 196 described in FIG. 8, and thus similar descriptions in this aspect will not be repeated hereinafter.

In some embodiments, the metal layers 212, 214, and 216 may include work function metal layer. In some embodiments, the metal layers 196, 204 and 206 are the P-work function metal (e.g., tungsten), and the metal layers 212, 214 and 216 may be an N-work function. N-work function metal provides the work function suitable for NMOS devices, which work function is lower than the mid-gap work function. The work function lower than the mid-gap work function is referred to as an N-work function, and the respective metal having the N-work function may be referred to as an N-work function metal or an N-metal. In some embodiments, the N-work function metal has an N-work function lower than about 4.3 eV. The N-work function of N-work function metal may also be in the range between about 3.8 eV and about 4.6 eV. In some embodiments, the N-work function metal may include titanium aluminum (TiAl), which may include, or free from or substantially free from other elements. In some other embodiments, the N-work function metal may include Ti, Ag, Al, TiAlN, TiAlC, TaC, TaCN, TaAlC, TaSiN, Mn, Zr or combinations thereof.

Figure 12:
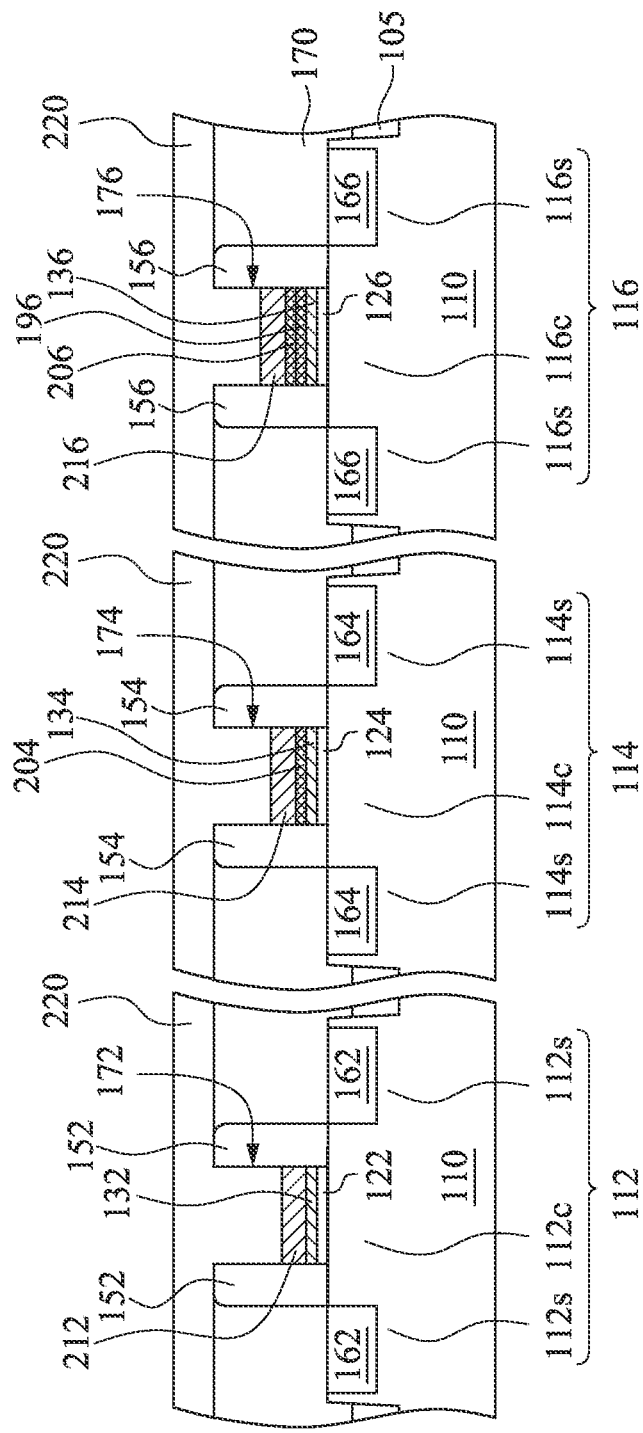

Reference is made to FIG. 12. A filling conductor 220 is formed over the substrate 110 and filling the gate trenches 172, 174, and 176. In some embodiments, the filling conductor 220 includes, for example, tungsten (W). The filling conductor 220 can be formed using ALD, PVD, CVD, or other suitable process. In some other embodiments, the filling conductor 220 includes aluminum (Al), copper (Cu) nickel (Ni), cobalt (Co), tungsten (W), TiN, or other suitable conductive material.

Figure 13:
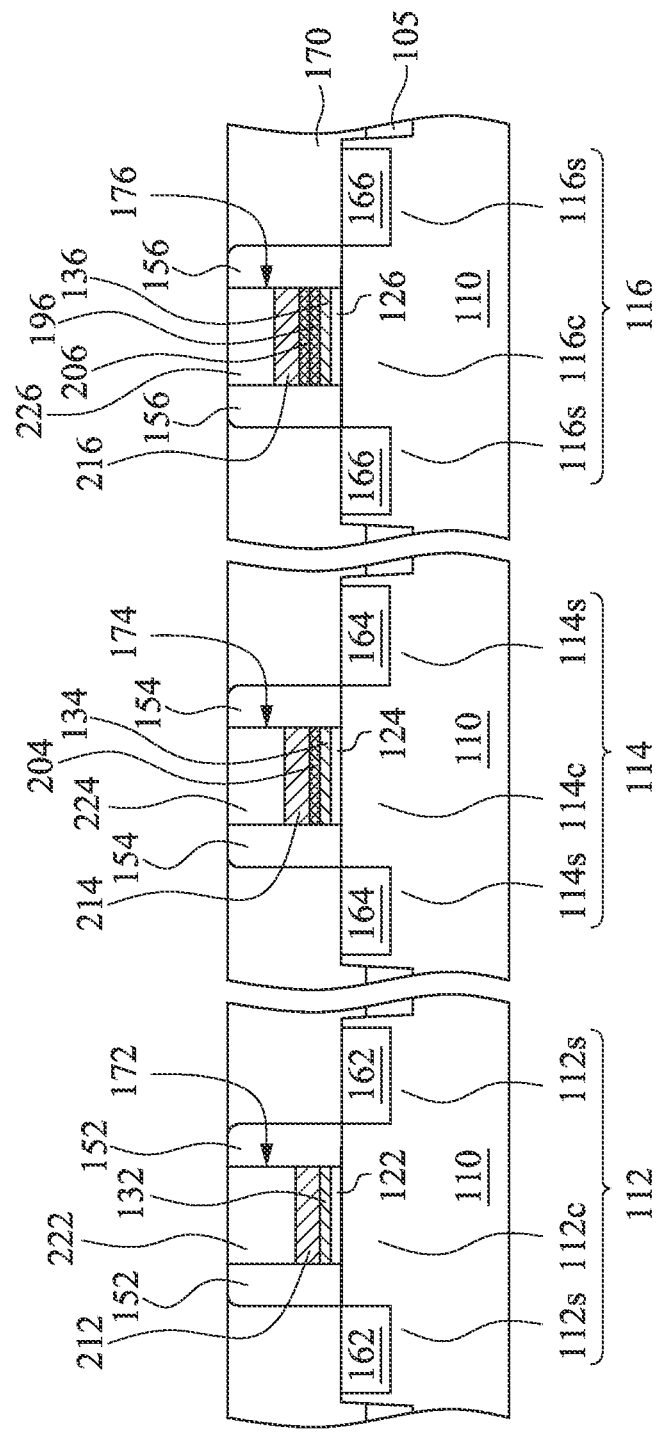

Reference is made to FIG. 13. A chemical mechanical planarization (CMP) process is applied to remove excessive filling conductor 220 to provide a substantially planar top surface. Portions of the filling conductor 220 respectively present in the gate trenches 172, 174, and 176 can be referred to as gate electrodes 222, 224 and 226.

In some embodiments of the present disclosure, the metal layers 196, 204, 206, 212, 214, and 216 may be formed via a bottom-up approach deposition. In this way, the gate trenches 172, 174, and 176 will substantially keep their original widths during the bottom-up deposition, since the materials of the metal layers are substantially not grown on the sidewalls of the gate trenches 172, 174, and 176. As a result, the metal layers 196, 204, 206, 212, 214, and 216 formed by bottom-up approach deposition may eliminate seams associated with conformal growth, and thus will improve the yield and reduce resistance of the device. On the other hand, the bottom-up deposition may simplify the process flow by, for example, reducing repeated etching processes which are used to remove unwanted metal layers on sidewalls of the gate trench. Further, the metal layers formed by bottom-up approach may include a homogeneous width along the gate length thereof, which in turn will reduce weak corner turn on (WCTO) effect.

FIGS. 14 to 22 are cross-sectional views of a method for manufacturing a semiconductor device at various stages in accordance with some embodiments of the present disclosure.

Figure 14:
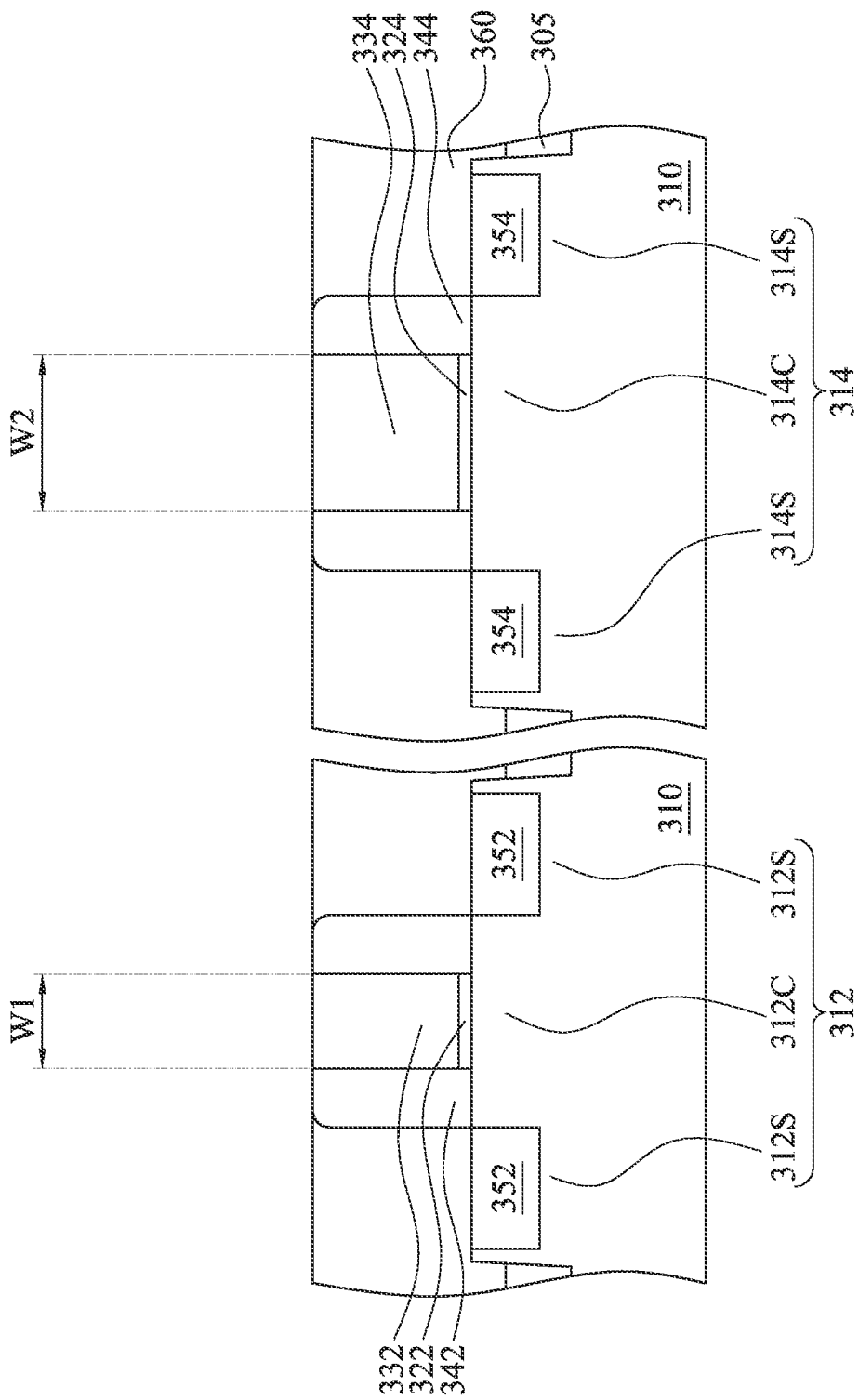
FIGS. 14 to 22 are cross-sectional views of a method for manufacturing a semiconductor device at various stages in accordance with some embodiments of the present disclosure.

Reference is made to FIG. 14. The structure shown in FIG. 14 is similar to the structure shown in FIG. 6, and thus similar descriptions in this aspect have been shown in accordance with FIGS. 1 to 6 and will not be repeated herein after. In FIG. 14, a substrate 310 includes fins 312 and 314. The fin 312 has a plurality of source/drain portions 312s, and a portion of the semiconductor fin 312 between the source/drain portions 312s can serve as a semiconductor channel 312c. Similarly, the fin 314 has a plurality of source/drain portions 314s, and a portion of the semiconductor fin 314 between the source/drain portions 314s can serve as a semiconductor channel 314c. A gate stack including gate dielectric 322 and a dummy gate structure 332 is formed over the fin 312, and gate spacers 342 are disposed on opposite sides of the dummy gate structure 332. Similarly, another gate stack including gate dielectric 324 and a dummy gate structure 334 is formed over the fin 314, and gate spacers 344 are disposed on opposite sides of the dummy gate structure 334. A plurality of epitaxy structures 352 are formed on opposite sides of the gate structure 332, and a plurality of epitaxy structures 354 are formed on opposite sides of the gate structure 334. An ILD layer 360 is formed over the substrate 310 and adjacent to the dummy gate structures 332 and 334.

In some embodiments, the dummy gate structure 332 has a width W1 shorter than a width W2 of the dummy gate structure 332. Accordingly, the channel 312C is shorter than the channel 314C, and thus the channel 312C can also be referred to as short-channel and the channel 314C can also be referred to as long-channel. It is noted that the widths W1 and W2 can be determined with predetermined values during patterning the dummy gate structures 332 and 334.

Figure 15:
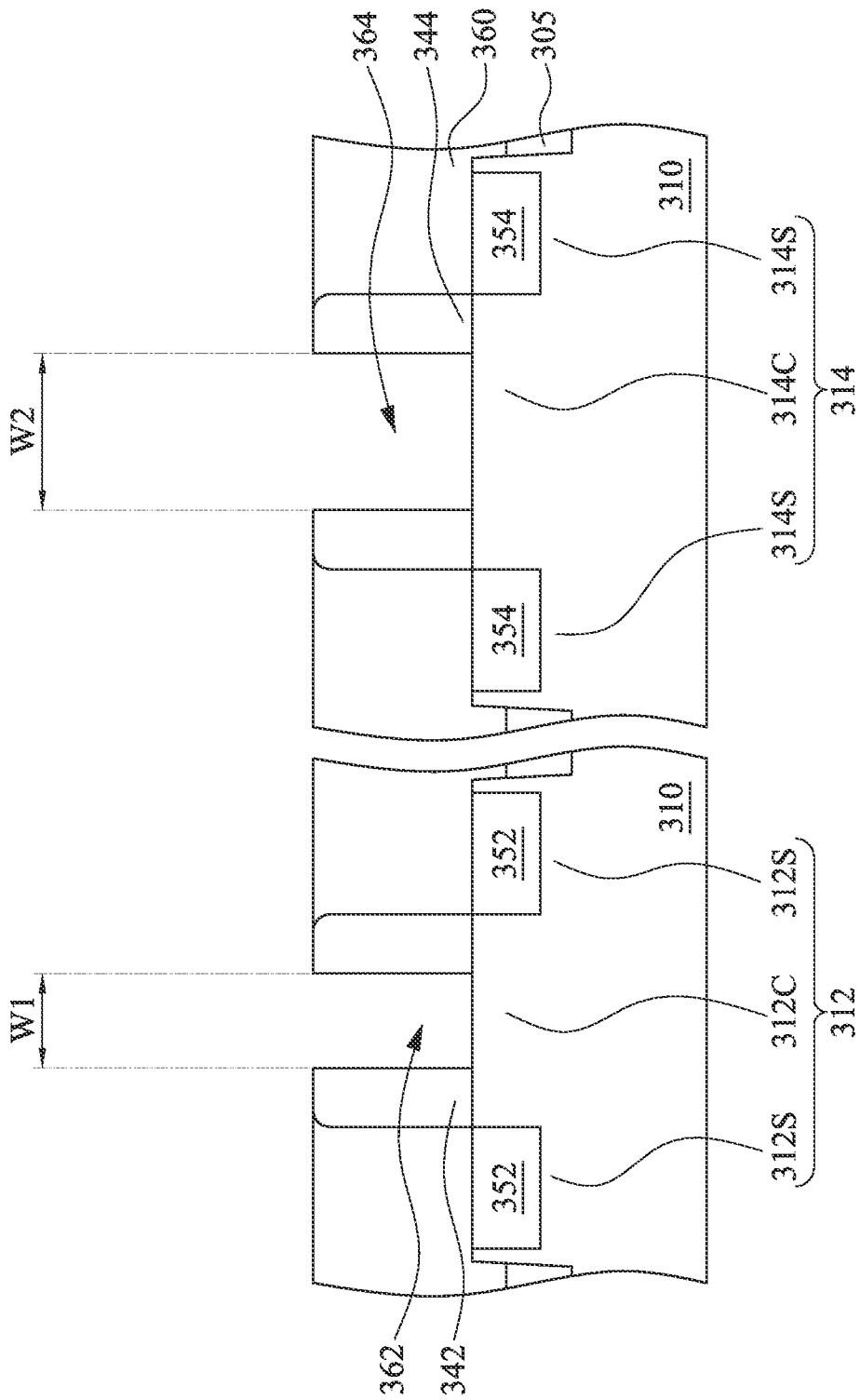

Reference is made to FIG. 15. The dummy gate structures 332 and 334, and the gate dielectrics 322 and 324 (see FIG. 14) are removed to form a gate trench 362 with the gate spacers 342 as its sidewall, and a gate trench 364 with the gate spacers 344 as its sidewall. The dummy gate structures 332 and 334, and the gate dielectrics 322 and 324 may be removed by dry etching, wet etching, or a combination of dry and wet etching. For example, a wet etching process may include exposure to a hydroxide containing solution (e.g., ammonium hydroxide), deionized water, and/or other suitable etchant solutions.

Figure 16:
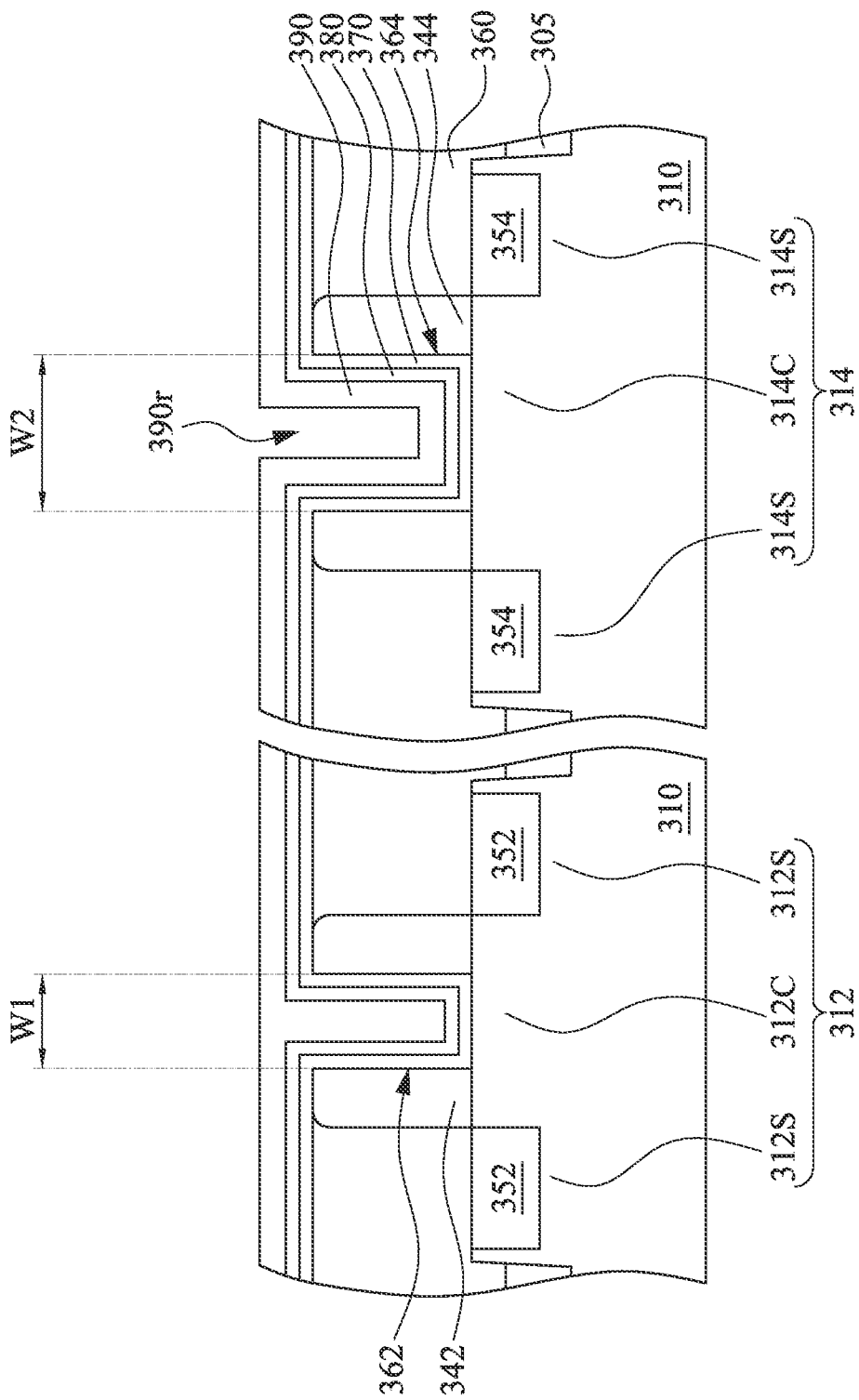

Reference is made to FIG. 16. A dielectric layer 370, a capping layer 380, and a work function metal layer 390 are formed sequentially over the substrate 310 and respectively in the gate trenches 362 and 364. In some embodiments, the dielectric layer 370, a capping layer 380, and a work function metal layer 390 may be formed by suitable process, such as PVD, CVD, and ALD. In some embodiments, the width W1 of gate trench 362 is small enough such that the work function metal layer 390 substantially fills the space between the capping layer 380, even the work function metal layer 390 is formed in a conformal manner. That is, the trench 362 is substantially filled with the work function metal layer 390 without space present therein. On the other hand, the width W2 of gate trench 364 is large enough such that the work function metal layer 390 is formed with a recess 390r therebetween. That is, the recess 390r is formed within the gate trench 364 after the work function metal layer 390 is formed.

In some embodiments, the capping layer 380 may include TiN, TaN, and WN. In some other embodiments, the capping layer 380 may be a composite layer, such as Ti/TiN layer, Ta/TaN layer, etc.

In some embodiments, the work function metal layer 390 may include a P-work function or N-work function metal. A P-work function metal may include, but is not limited to, titanium nitride (TiN). Titanium nitride can provide a work function suitable for PMOS devices, which work function is higher than the mid-gap work function (about 4.5 eV) that is in the middle of the valance band and the conduction band of silicon. The work function higher than the mid-gap work function is referred to as a P-work function, and the respective metal having the P-work function is referred to as a P-work function metal or P-metal. A N-work function metal provides the work function suitable for NMOS devices, which work function is lower than the mid-gap work function. The work function lower than the mid-gap work function is referred to as an N-work function, and the respective metal having the N-work function may be referred to as an N-work function metal or an N-metal. In some embodiments, the N-work function metal has an N-work function lower than about 4.3 eV. The N-work function of N-work function metal may also be in the range between about 3.8 eV and about 4.6 eV. In some embodiments, the N-work function metal may include titanium aluminum (TiAl), which may include, or free from or substantially free from other elements. In some other embodiments, the N-work function metal may include Ti, Ag, Al, TiAlN, TiAlC, TaC, TaCN, TaAlC, TaSiN, Mn, Zr or combinations thereof.

Figure 17:
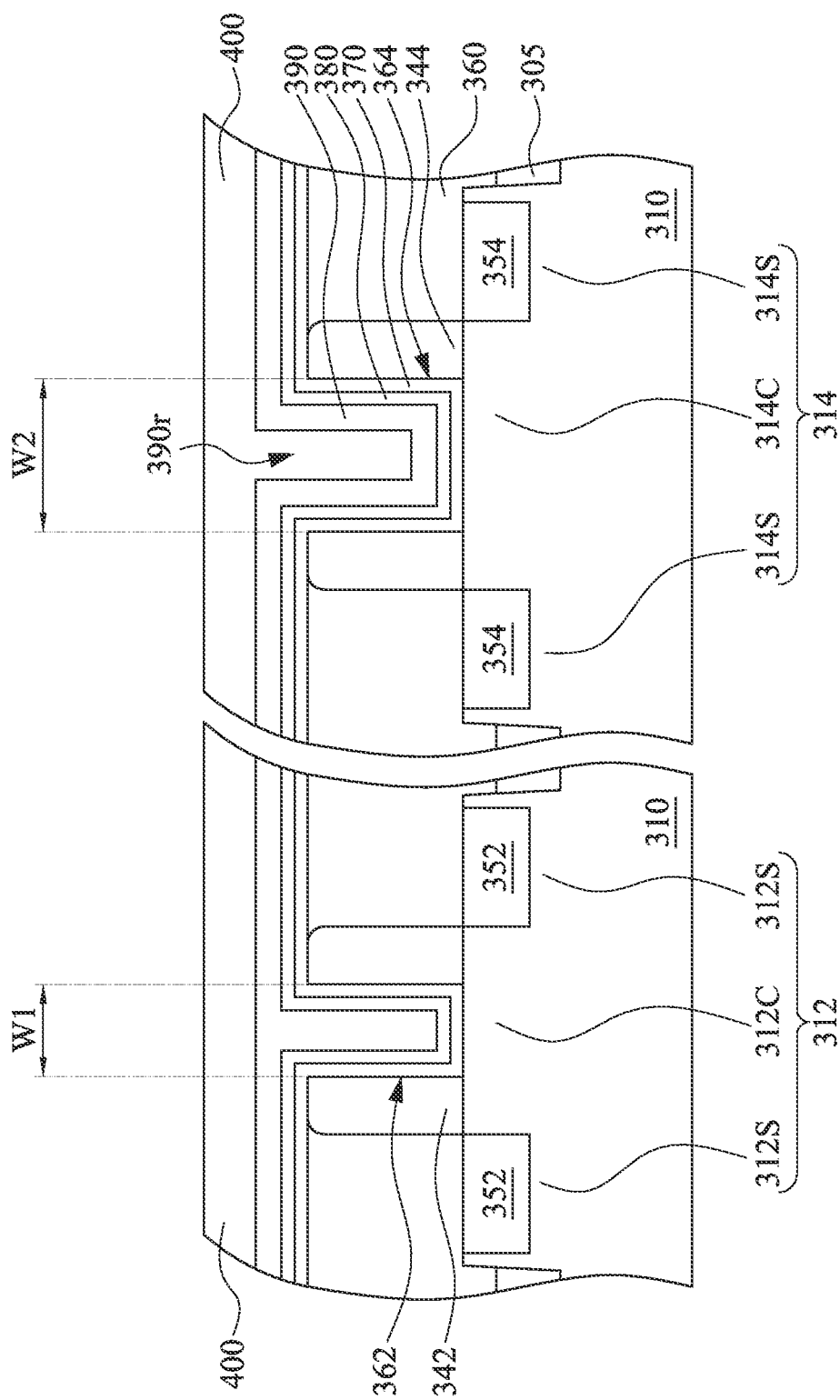

Reference is made to FIG. 17. A filling conductor 400 is formed over the substrate 310. In some embodiments, the filling conductor 220 includes, for example, tungsten (W). The filling conductor 220 can be formed using ALD, PVD, CVD, or other suitable process. In some other embodiments, the filling conductor 220 includes aluminum (Al), copper (Cu) nickel (Ni), cobalt (Co), tungsten (W), or other suitable conductive material. In some embodiments, the filling conductor 400 fills the recess 390r. That is, the filling conductor 400 is formed within the gate trench 364. However, the filling conductor 400 does not fill in the gate trench 362, since the gate trench 362 is already filled with the work function metal layer 390.

Figure 18:
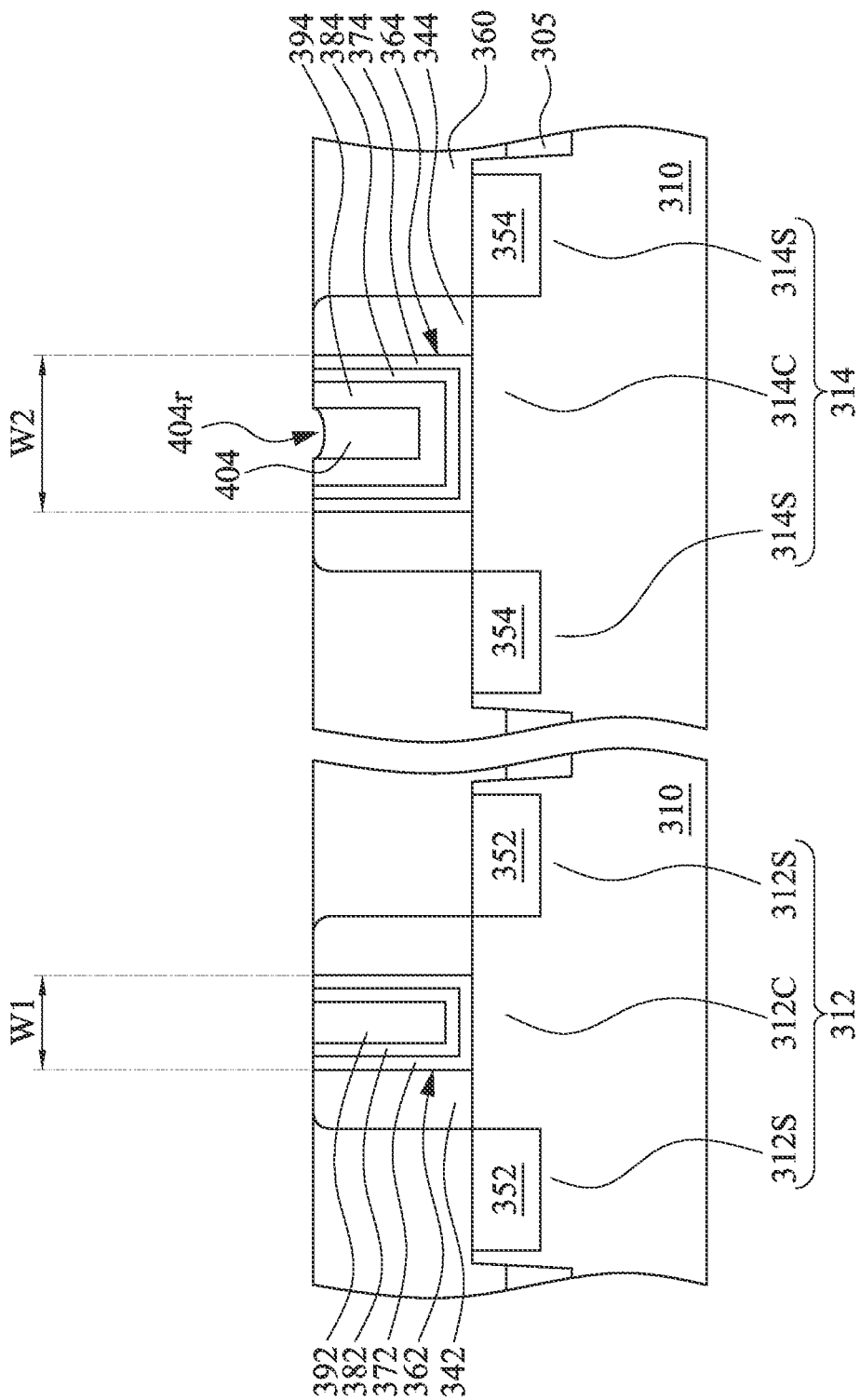

Reference is made to FIG. 18. A chemical mechanical planarization (CMP) process is applied to remove excessive dielectric layer 370, capping layer 380, work function metal layer 390, and filling conductor 400 to provide a substantially planar top surface. As a result, the gate dielectric 372, the capping layer 382, and the work function metal layer 392 are present in gate trench 362. The gate dielectric 374, the capping layer 384, the work function metal layer 394, and the filling conductor 404 are present in gate trench 364. In some embodiments, the trench 362 is substantially free from the material of filling conductor 404.

In some embodiments, during the CMP process, a CMP dishing effect may occurs such that a recess 404r may present in the filling conductor 404. The occurrence of a CMP dishing effect is mainly due to the fact that a polishing table has a flexible polishing pad. When CMP is performed on the substrate surface with height fluctuations, the polishing pad is located above the substrate surface. Therefore, the polishing pad may deform along the substrate profile when the polishing table applies a downward stress on the polishing pad. The polishing pad may bend more readily downwards to the region with a larger surface area (i.e. the filling conductor 404) than the surrounding regions, so that this region is polished prior to other regions, causing the dishing effect.

Figure 19:
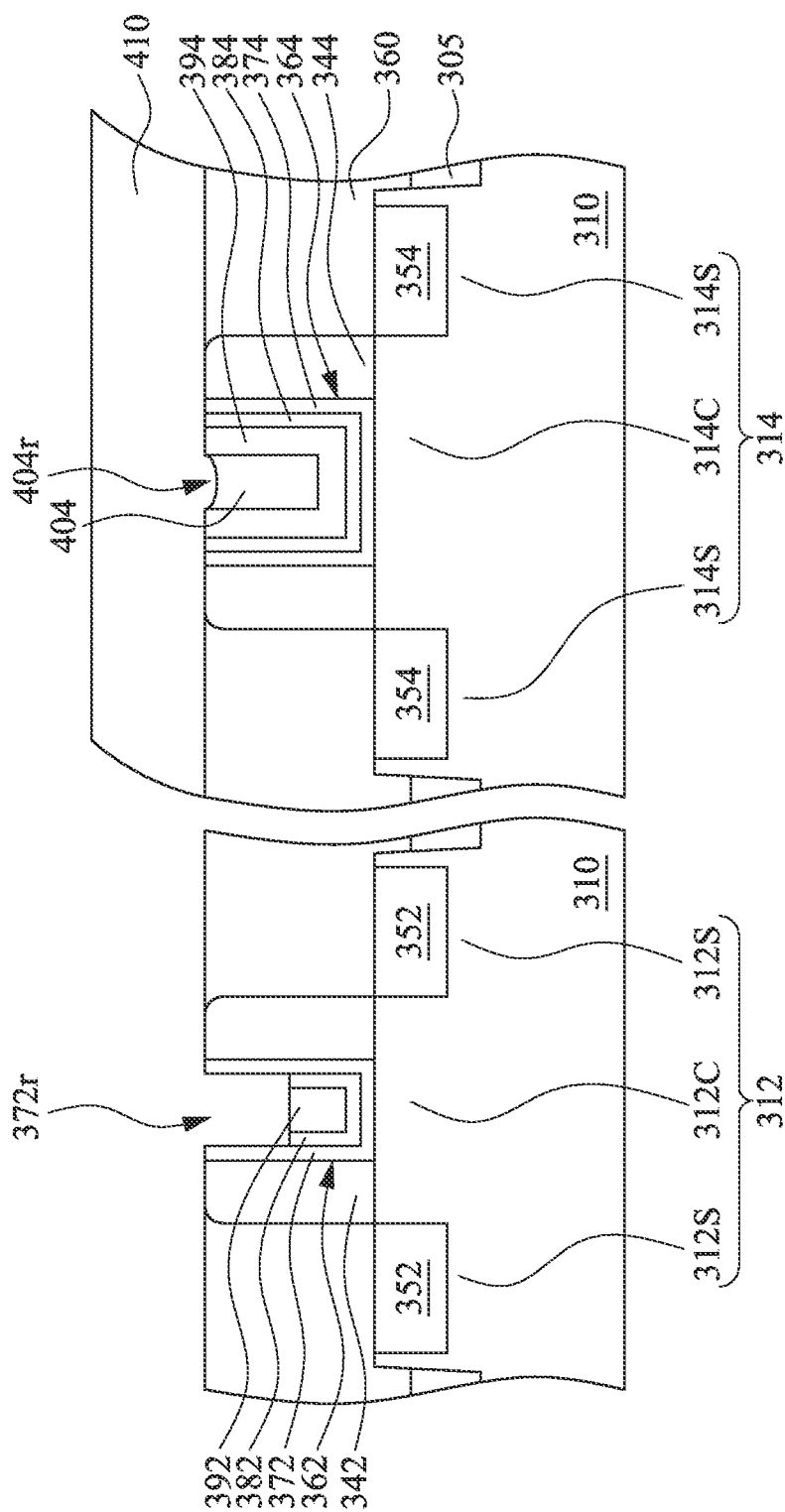

Reference is made to FIG. 19. A mask layer 410 is formed over the substrate 310 and is patterned to cover the fin 314. In some embodiments, the mask layer 410 is patterned such that the gate dielectric 372, the capping layer 382, and the work function metal layer 392 are exposed. Then, portions of the capping layer 382, and the work function metal layer 392 are partially removed by suitable process, such as a metal gate etch back process, to form a recess 372r with the gate dielectric 372 as its sidewalls. In some embodiments, the mask layer 410 may include a patterned antireflective coating (BARC) layer.

Figure 20:
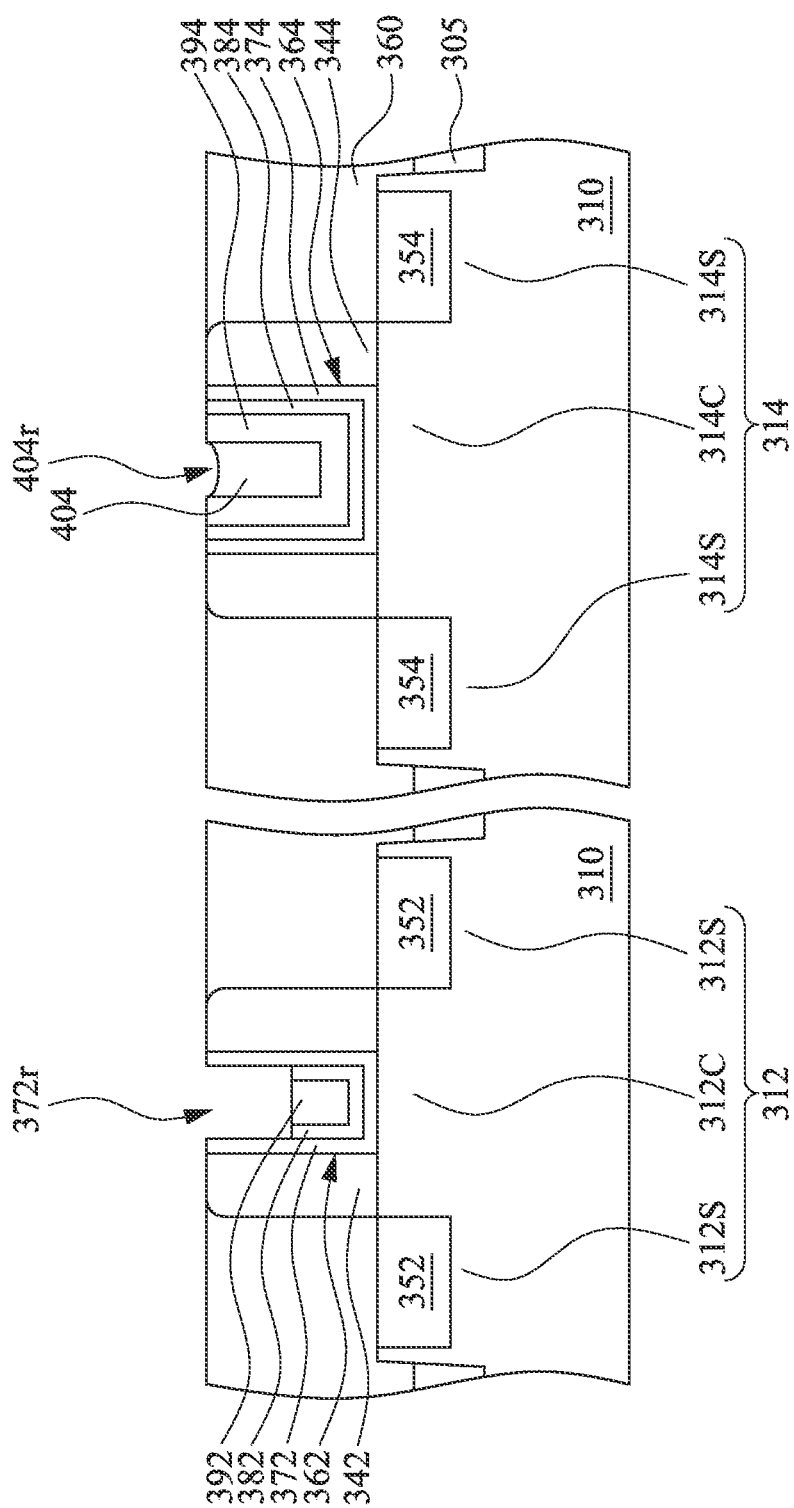

Reference is made to FIG. 20. The mask layer 410 is removed, and the gate dielectric 374, the capping layer 384, the work function metal layer 394, and the filling conductor 404 are exposed.

Figure 21:
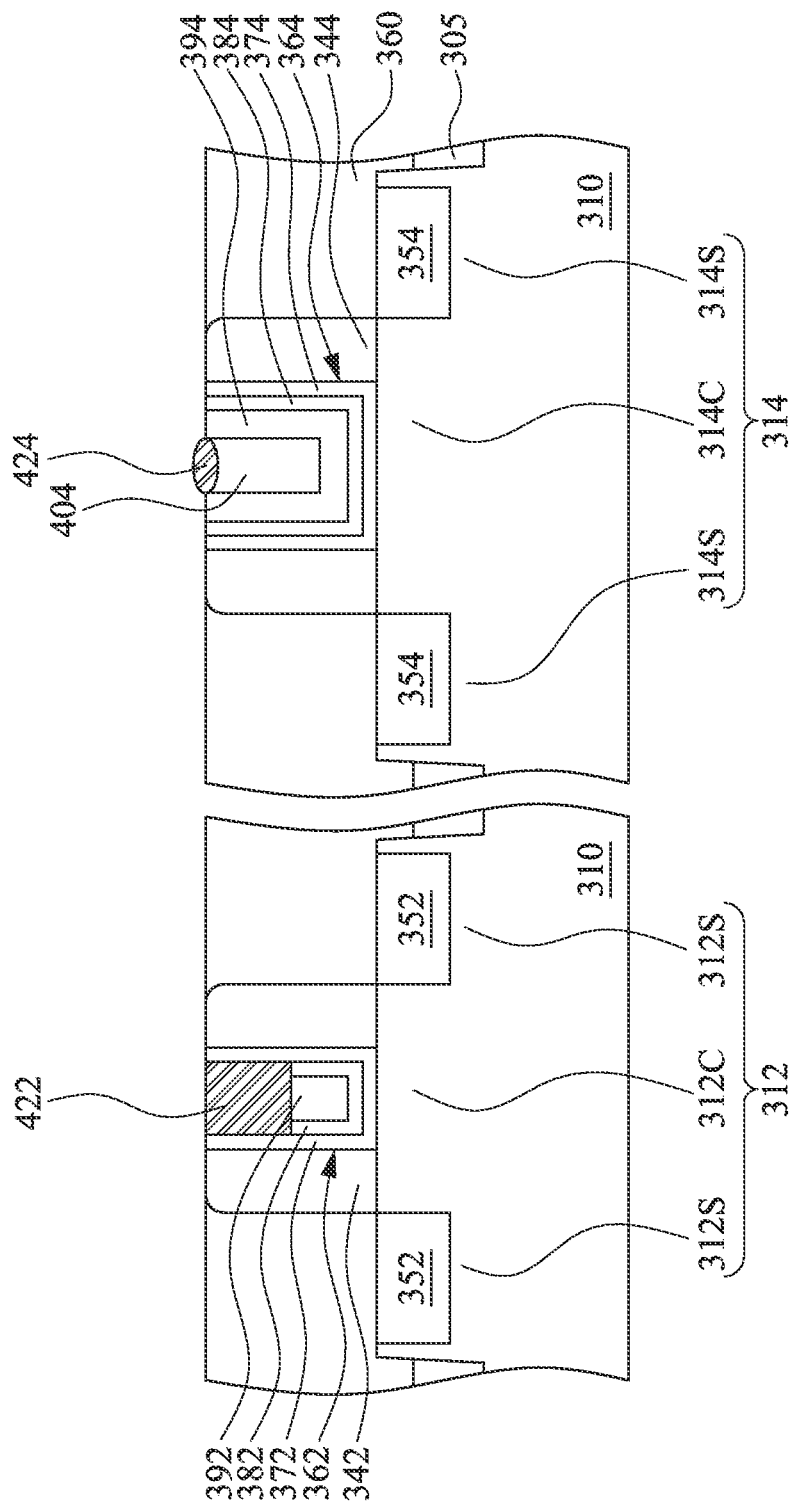

Reference is made to FIG. 21. Metal layers 422 and 424 are formed respectively in the recesses 372r and 404r. In some embodiments, metal layers 422 and 424 are formed via a bottom-up approach. In some embodiments, the metal layers 422 and 424 may include but not limited to, for example, tungsten (W). Thus, by using the bottom-up approach deposition, the metal layer 422 formed in the recess 372r may be applied to reduce the resistance in the short channel device, and the metal layer 424 is formed in the recess 404r may recover the CMP dishing effect in the long channel device.

Figure 22:
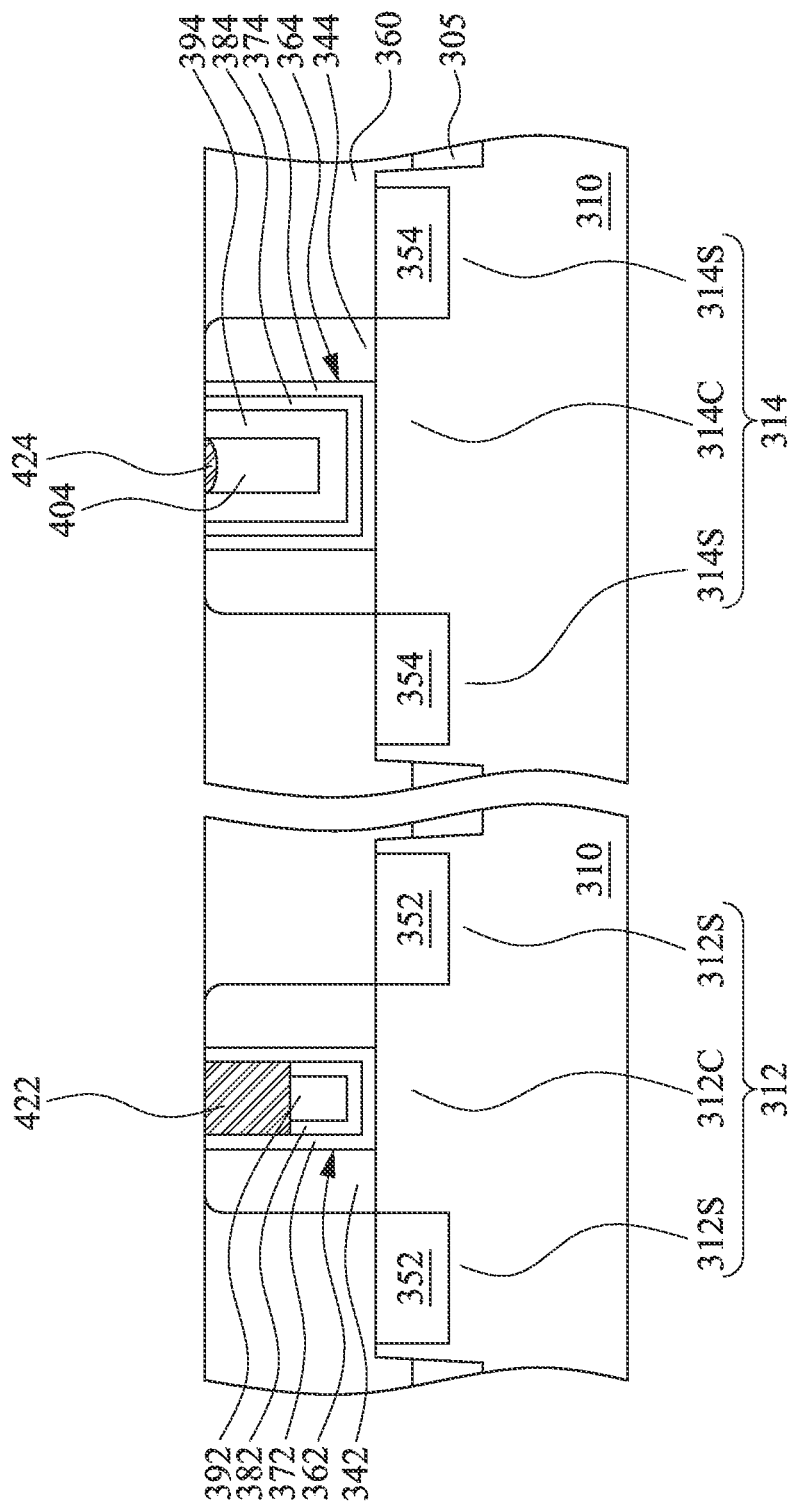

Reference is made to FIG. 22. A chemical mechanical planarization (CMP) process is applied to remove excessive metal layers 422 and 424. In some embodiments, the metal layer 424 remains in the recess 404r of the filling conductor 404. The interface between the metal layer 424 and the filling conductor 404 is curved. Stated another way, the metal layer 424 has a concaved bottom surface. Alternately, the metal layer 424 tapers toward the substrate 310.

FIGS. 23 to 28 are cross-sectional views of a method for manufacturing a semiconductor device at various stages in accordance with some embodiments of the present disclosure.

Figure 23:
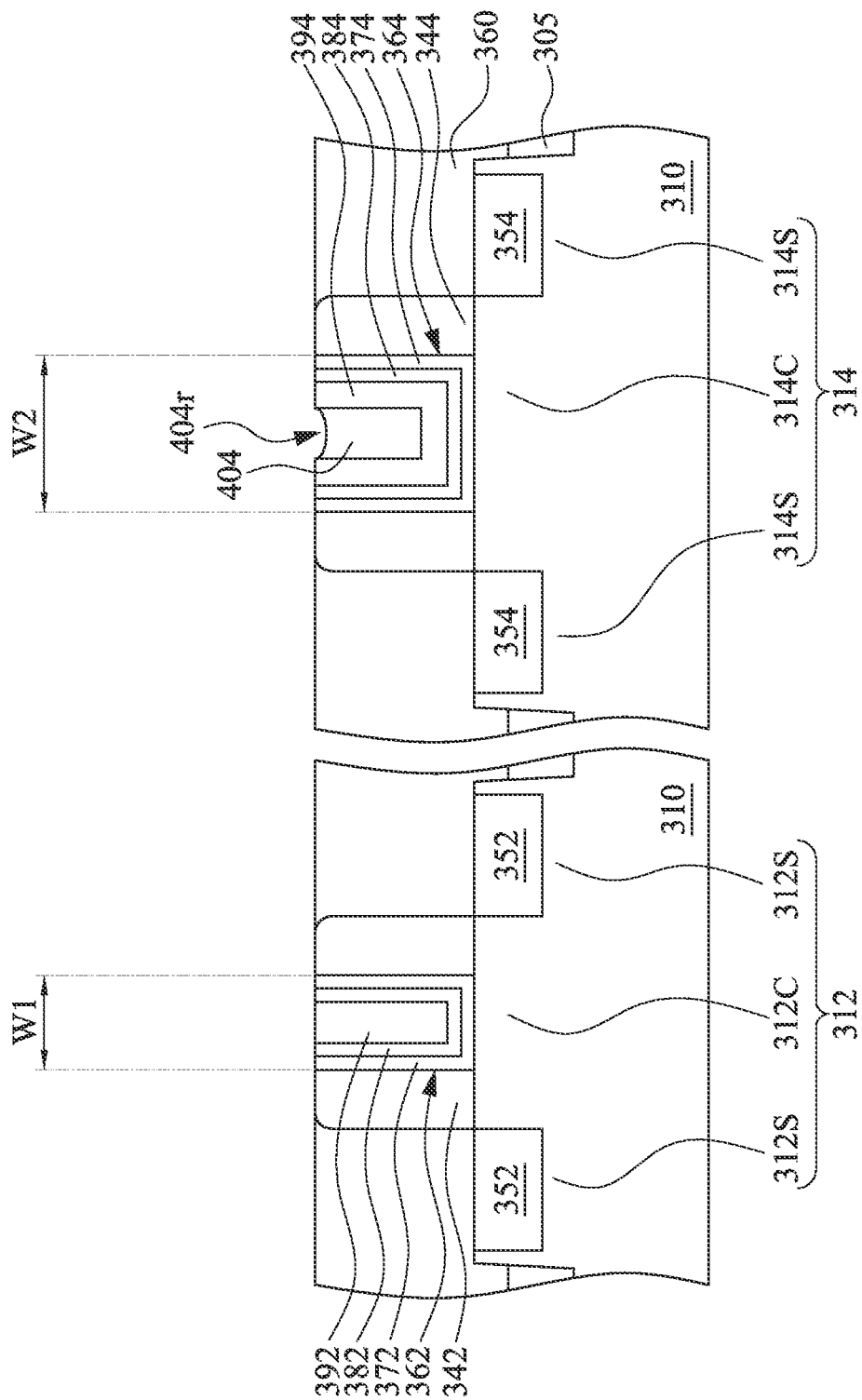
FIGS. 23 to 28 are cross-sectional views of a method for manufacturing a semiconductor device at various stages in accordance with some embodiments of the present disclosure.

Reference is made to FIG. 23. FIG. 23 is similar to the structure described in the 18, and the formation thereof can be referred to those described in FIGS. 18 to 23. Accordingly, relevant structures of FIG. 23 are labeled the same as those of FIG. 18, and will not be repeated herein after.

Figure 24:
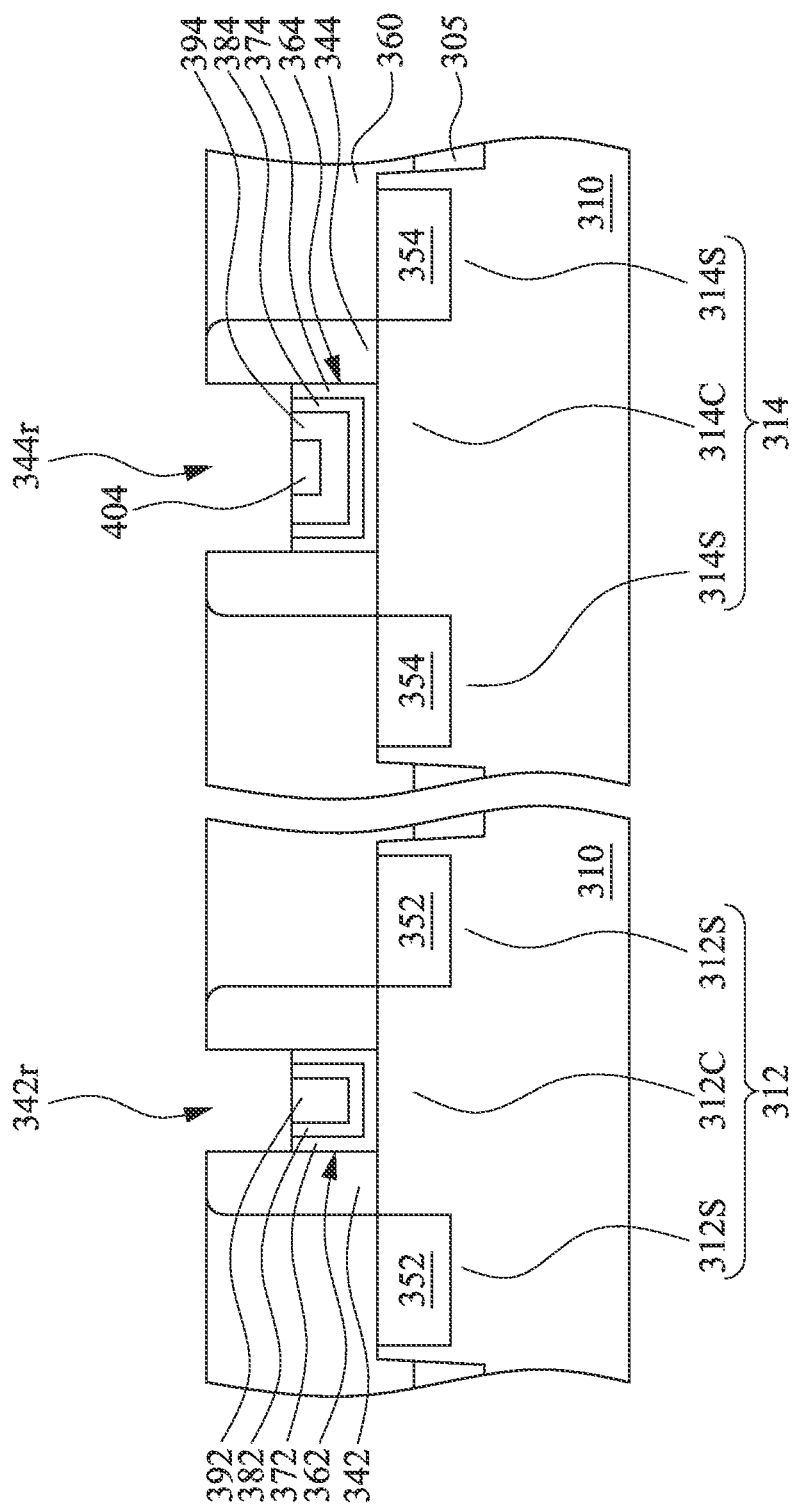

Reference is made to FIG. 24. A metal gate etch back process is performed to partially remove the gate dielectrics 372 and 374, the capping layers 382 and 384, the work function metal layers 392 and 394, and the filling conductor 404 to form recesses 342r and 344r between the spacers 342 and 344, respectively.

Figure 25:
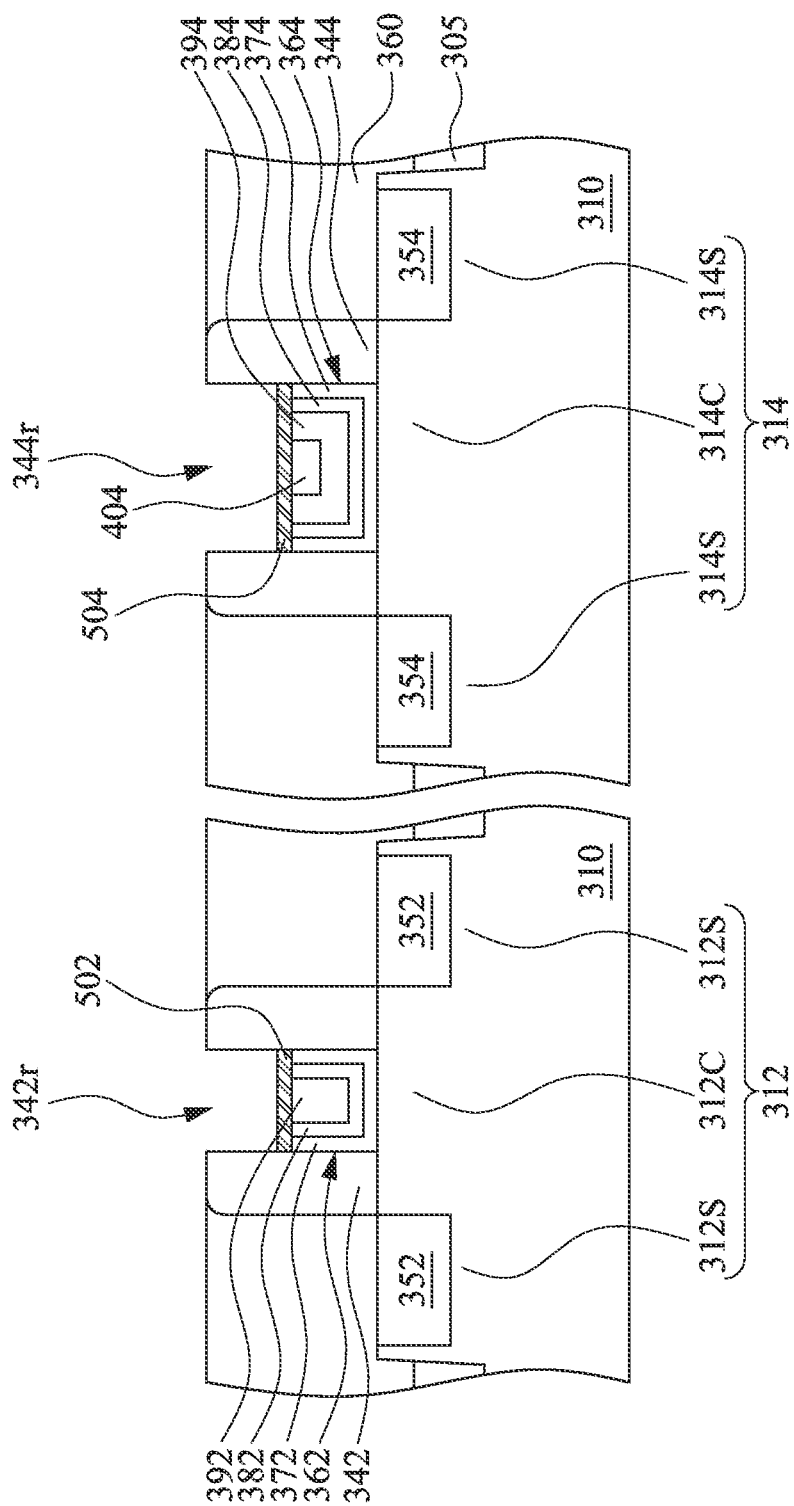

Reference is made to FIG. 25. Etching barrier layers 502 and 504 are formed respectively in the recesses 342r and 344r by suitable process, such as AVD or ALD. In some embodiments, the etching barrier layers 502 and 504 are formed in the recesses 342r and 344r via a bottom-up approach. That is, the etching barrier layers 502 and 504 are selectively grown on the metal surface, such as the capping layers 382 and 384, the work function metal layers 392 and 394, and the filling conductor 404, and thus the sidewalls of the recesses 342r and 344r are substantially free from the growth of the etching barrier layers 502 and 504. In some embodiments, the etching barrier layers 502 and 504 may include but not limited to, for example, tungsten (W). In some embodiments, portions of the etching barrier layers 502 and 504 may overflow over the gate dielectrics 372 and 374, such that the etching barrier layers 502 and 504 may also cover the exposed surface of the gate dielectrics 372 and 374. In some other embodiments, the exposed surface of the gate dielectrics 372 and 374 are not cover by the etching barrier layers 502 and 504. That is, after the etching barrier layers 502 and 504 are formed, the gate dielectrics 372 and 374 remain exposed. Since the etching barrier layers 502 and 504 are formed in a bottom-up manner, the formation thereof may be simplified by, for example, reducing repeated etching processes which are used to remove unwanted metal layers on sidewalls of the gate trench associated with conformal growth.

Figure 26:
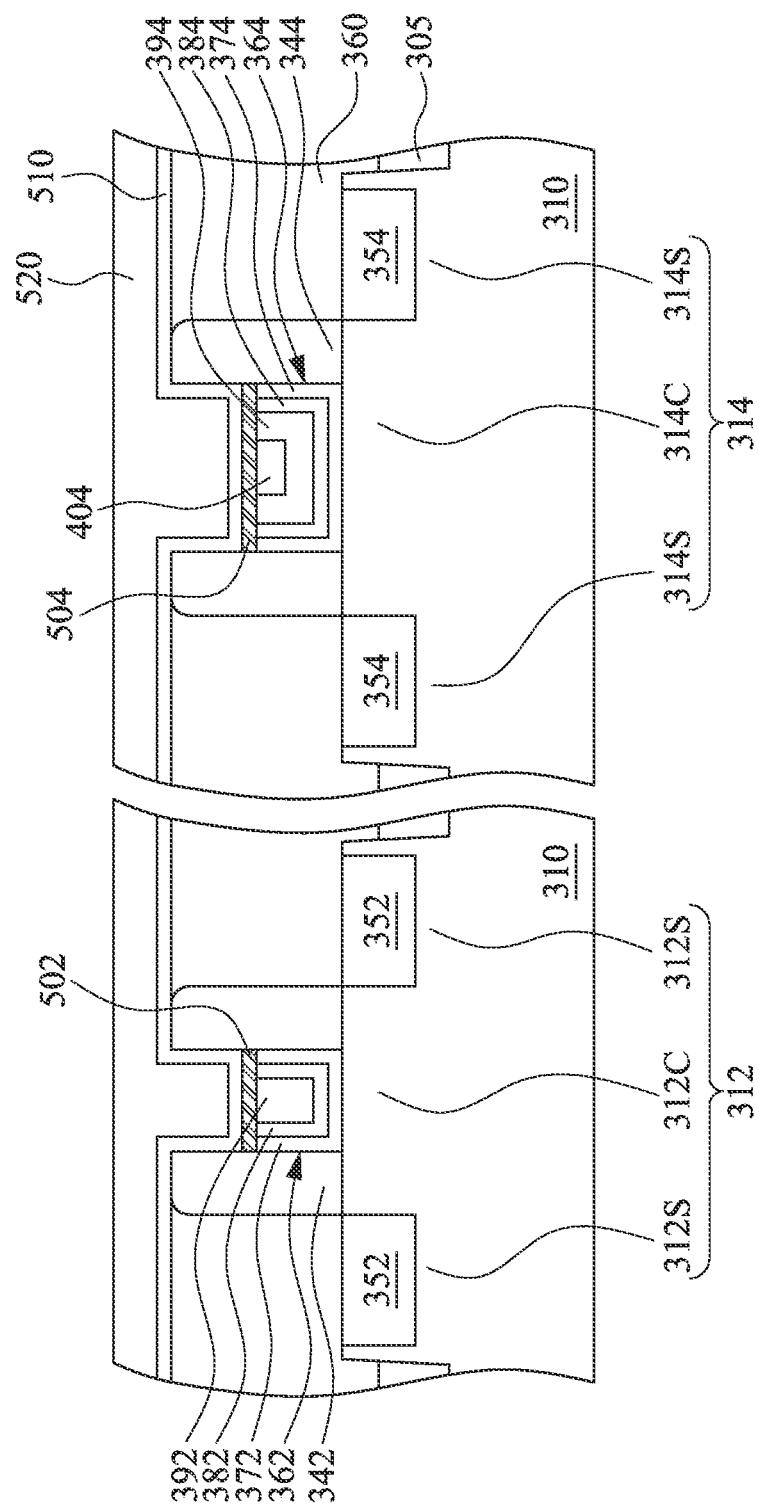

Reference is made to FIG. 26. A liner 510 and a hard mask 520 are formed sequentially over the substrate 310 and in the recesses 342r and 344r. In some embodiments, the material of the hard mask 520 includes, for example, SiO, SiN, SiOC, and SiOCN. The hard layer 520 serves to protect the underlying components in the subsequent via formation process, and it can be referred to as a self-aligned contact (SAC) helmet in some embodiments. In some embodiments, the material of the liner 510 includes Si-based oxide, or the like.

Figure 27:
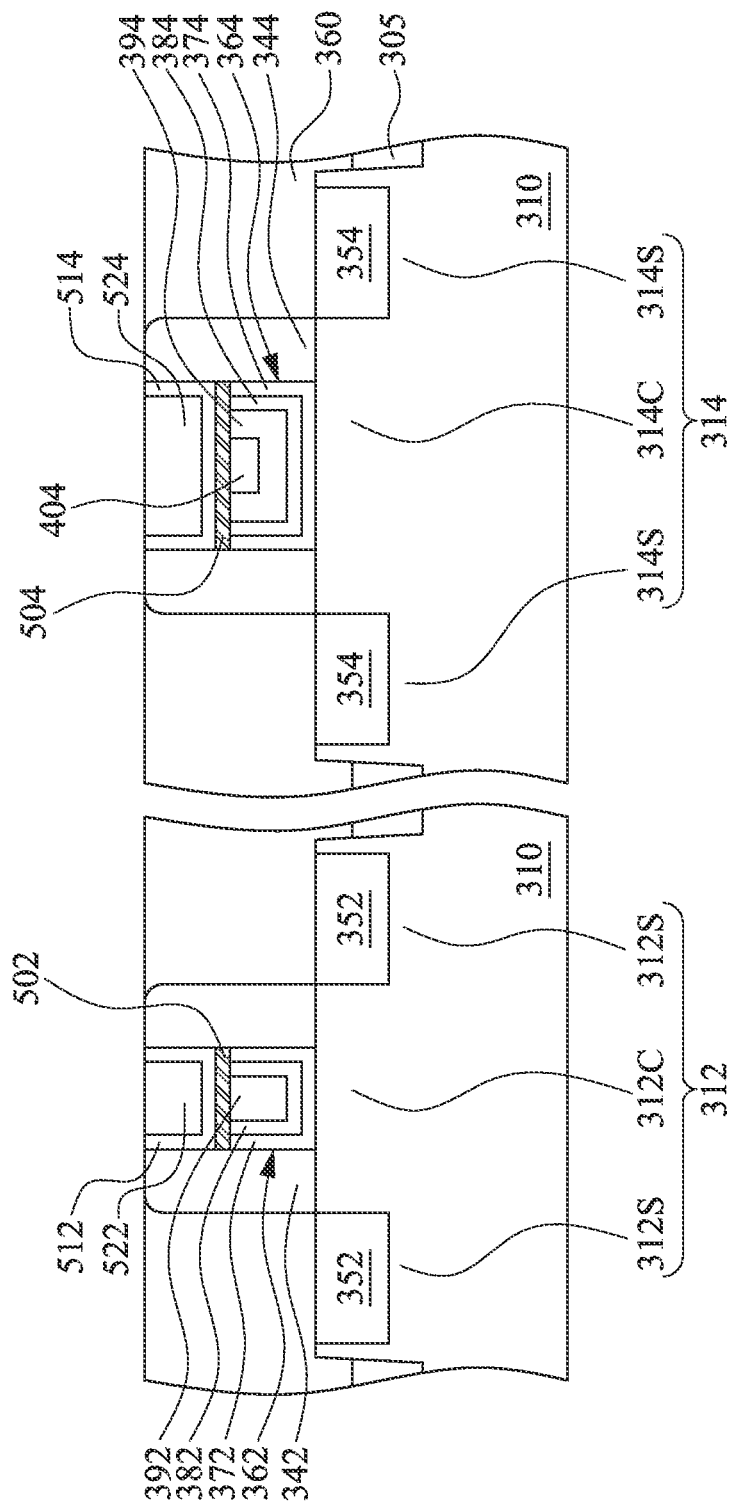

Reference is made to FIG. 27. A chemical mechanical planarization (CMP) process is applied to remove excessive liner 510 and a hard mask 520. As such, the top surfaces of the liner 510, the hard mask 520, and the ILD layer 360 are substantially coplanar. After the CMP process, portions of the liner 510 and the hard mask 520 remain over the fin 312 are referred to as liner 512 and hard mask 522, and portions of the liner 510 and the hard mask 520 remain over the fin 314 are referred to as liner 514 and hard mask 524, respectively.

Figure 28:
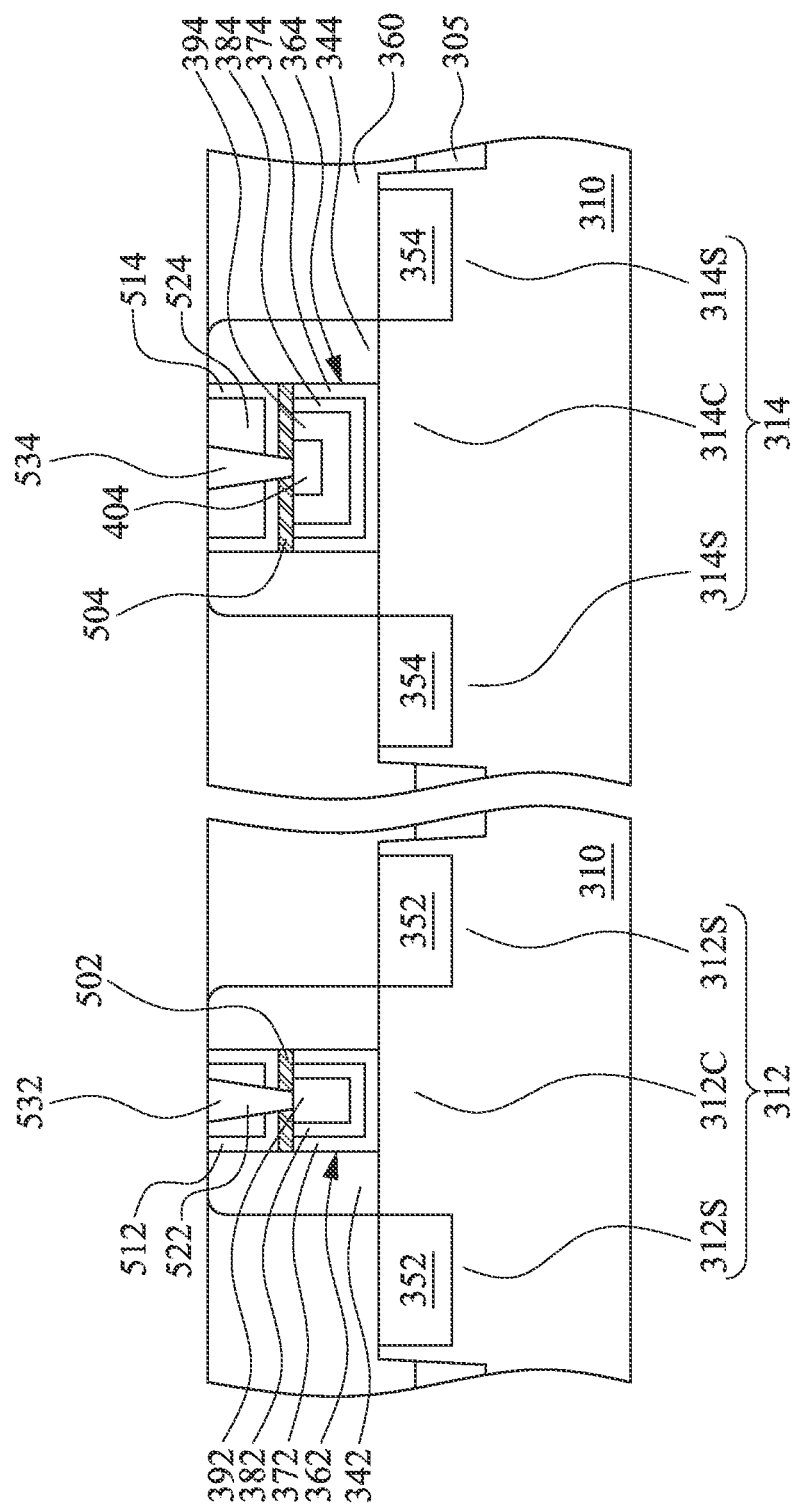

Reference is made to FIG. 28. Gate contact plugs 532 534 are formed through the hard masks 522 and 524, respectively. The contact 532 penetrates through the hard mask 522, the liner 512, and the etching barrier layer 502, and is in contact with the work function metal layer 392. On the other hand, contact 534 penetrates through the hard mask 524, the liner 514, and the etching barrier layer 504, and is in contact with the filling conductor 404. The contact plugs 532 and 534 may be formed by, for example, etching the hard masks 522 and 524, the liners 512 and 514, and the etching barrier layers 502 and 504 to form recesses therein until the work function metal layer 392 and the filling conductor 404 are exposed; filling a conductive material into the recesses; and performing a CMP process to remove excessive conductive material. In some embodiments, the contact plugs 532 and 534 may include TiN, TaN, Ta, Ti, Hf, Zr, Ni, W, Co, Cu, or Al. In some embodiments, the contact plugs 532 and 534 may be formed by CVD, PVD, plating, ALD, or other suitable technique.

According to the aforementioned embodiments, it can be seen that the present disclosure offers advantages over FinFET devices. It is understood, however, that other embodiments may offer additional advantages, and not all advantages are necessarily disclosed herein, and that no particular advantage is required for all embodiments. One advantage is that at least one metal layers are formed in a gate trench via a bottom-up approach, such that the deposition window may keep large, which in turn will facilitate deposition of the metal layers formed in later steps. Further, the metal layers formed by bottom-up approach deposition may eliminate seams associated with conformal growth, and thus will improve the yield and reduce resistance of the device. On the other hand, the bottom-up deposition may simplify the process flow by, for example, reducing repeated etching processes which are used to remove unwanted metal layers on sidewalls of the gate trench. Further, the metal layers formed by bottom-up approach may include a homogeneous widths along the gate length thereof, which will turn will reduce weak corner turn on (WCTO) effect. Another advantage is that the bottom-up deposition may be applied to reduce resistance in short channel device, and may also recover a dishing effect in long channel device. Another advantage is that the bottom-up deposition may be applied to form etching barrier layers in different devices including different channel lengths, so as to provide a homogeneous environment during forming contacts plug in different devices, and the yield may also be improved.

In some embodiments of the present disclosure, a semiconductor device includes a semiconductor substrate, a first gate structure over the substrate, a second gate structure over the substrate, first gate spacers on opposite sidewalls of the first gate structure, second gate spacers on opposite sidewalls of the second gate structure, first and second metal layers spanning over the first and second gate structures, first and second contact plugs extending through the first and second metal layers, respectively. The first gate structure includes a first gate dielectric, and a first work function metal layer over the first gate dielectric. The second gate structure is wider than the first gate structure, wherein the second gate structure includes a second gate dielectric, a second work function metal layer over the second gate dielectric, and a filling conductor over the second work function metal layer. The first contact plug is in contact with the first work function metal layer, and the second contact plug is in contact with the filling conductor.

In some embodiments of the present disclosure, a semiconductor device includes a semiconductor substrate, a first gate structure over the substrate, a second gate structure over the substrate, first gate spacers on opposite sidewalls of the first gate structure, second gate spacers on opposite sidewalls of the second gate structure, a first metal layer over and in contact with the first gate structure, and a second metal layer over and in contact with the second gate structure. The first gate structure includes a first gate dielectric, and a first work function metal layer over the first gate dielectric. The second gate structure includes a second gate dielectric, a second work function metal layer over the second gate dielectric; and a filling conductor over the second work function metal layer. The second metal layer has a top surface level with a top surface of the first metal layer, and a bottom surface higher than a bottom surface of the first metal layer, and wherein the bottom surface of the first metal layer is flatter than the bottom surface of the second metal layer.

In some embodiments of the present disclosure, a semiconductor device includes a semiconductor substrate, a first gate structure over the substrate, a second gate structure over the substrate, first gate spacers on opposite sidewalls of the first gate structure, and second gate spacers on opposite sidewalls of the second gate structure. The first gate structure includes a first gate dielectric, a first work function metal (WFM) layer over the first gate dielectric, a second WFM layer over the first WFM layer, wherein the first and second WFM layers have a bar-shape cross-section, and a first filling metal over the second WFM layer. The second gate structure includes, a second gate dielectric, a third WFM layer over the second gate dielectric, a fourth WFM layer over the third WFM layer, a fifth WFM layer over the fourth WFM layer, and a second filling metal over the fifth WFM layer. The third, fourth, and fifth WFM layers have a bar-shape cross-section, and the first, third, and fourth WFM layers are made of a P-work function metal, and the second and fifth WFM layers are made of an N-work function metal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a first gate structure over the substrate and comprising:
      a first gate dielectric; and
      a first work function metal layer over the first gate dielectric;
   first gate spacers on opposite sidewalls of the first gate structure;
   a first tungsten layer spanning over the first gate structure, wherein a top surface of the first tungsten layer is lower than top surfaces of the first gate spacers;
   a hard mask over the first tungsten layer; and
   a liner lining the hard mask, wherein sidewalls and a bottom surface of the hard mask are covered by the liner.

2. The semiconductor device of claim 1, wherein the first tungsten layer is in contact with the first gate spacers.

3. The semiconductor device of claim 1, further comprising a contact plug penetrating through the first tungsten layer and in contact with the first gate structure.

4. The semiconductor device of claim 3, wherein the contact plug penetrates through the hard mask and the liner.

5. The semiconductor device of claim 4, wherein the liner is in contact with the first gate spacers and the first tungsten layer.

6. The semiconductor device of claim 1, further comprising:
a second gate structure over the substrate, the second gate structure being wider than the first gate structure and having more layers than the first gate structure;
second gate spacers on opposite sidewalls of the second gate structure; and
a second tungsten layer spanning over the second gate structure, wherein a top surface of the second tungsten layer is lower than top surfaces of the second gate spacers.

7. The semiconductor device of claim 6, wherein the second gate structure comprises:
a second gate dielectric;
a second work function metal layer over the second gate dielectric; and
a filling conductor over the second work function metal layer.

8. A semiconductor device, comprising:
a substrate;
a gate structure over the substrate;
gate spacers on opposite sidewalls of the gate structure;
a conductive layer spanning over the gate structure and in contact with the gate spacers;
a hard mask over the conductive layer; and
a liner in contact with the gate spacers, the conductive layer, and the hard mask, wherein the liner has a portion vertically between the hard mask and the conductive layer.

9. The semiconductor device of claim 8, wherein the conductive layer is made of tungsten.

10. The semiconductor device of claim 8, wherein the conductive layer is in contact with the gate spacers.

11. The semiconductor device of claim 8, wherein a top surface of the conductive layer is lower than top surfaces of the gate spacers.

12. The semiconductor device of claim 8, further comprising a contact plug in contact with the gate structure.

13. The semiconductor device of claim 12, wherein the contact plug is in contact with the conductive layer.

14. The semiconductor device of claim 13, wherein the contact plug is in contact with the hard mask.

15. The semiconductor device of claim 14, wherein the contact plug is in contact with the liner.

16. A semiconductor device, comprising:
a substrate;
a first gate structure over the substrate and comprising:
a first gate dielectric; and
a first work function metal layer over the first gate dielectric;
a second gate structure over the substrate and comprising:
a second gate dielectric;
a second work function metal layer over the second gate dielectric; and
a filling conductor over the second work function metal layer;
first gate spacers on opposite sidewalls of the first gate structure;
second gate spacers on opposite sidewalls of the second gate structure;
a first tungsten layer in contact with the first gate structure; and
a second tungsten layer in contact with the second gate structure, wherein an interface between the second tungsten layer and the second gate structure has a curved shape, wherein a top end of the second gate dielectric and a top end of the second work function metal layer are level with a top surface of the second tungsten layer.

17. The semiconductor device of claim 16, wherein a bottom surface of the first tungsten layer is lower than a bottom surface of the second tungsten layer.

18. The semiconductor device of claim 16, wherein the first tungsten layer is in contact with the first gate spacers and the second tungsten layer is spaced apart from the first gate spacers.

19. The semiconductor device of claim 16, wherein the second gate structure is wider than the first gate structure.

20. The semiconductor device of claim 19, wherein the second gate structure has more layers than the first gate structure.

* * * * *